(12) United States Patent
Nishimura et al.

(10) Patent No.: US 9,293,594 B2
(45) Date of Patent: Mar. 22, 2016

(54) CIRCUIT BOARD AND DISPLAY DEVICE

(71) Applicant: Sharp Kabushiki Kaisha, Osaka-shi, Osaka (JP)

(72) Inventors: Jun Nishimura, Osaka (JP); Hideki Kitagawa, Osaka (JP); Atsuhito Murai, Osaka (JP); Hajime Imai, Osaka (JP); Shinya Tanaka, Osaka (JP); Mitsunori Imade, Osaka (JP); Tetsuo Kikuchi, Osaka (JP); Junya Shimada, Osaka (JP); Kazunori Morimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/215,338

(22) Filed: Mar. 17, 2014

(65) Prior Publication Data
US 2014/0197412 A1    Jul. 17, 2014

Related U.S. Application Data

(63) Continuation of application No. 13/695,082, filed as application No. PCT/JP2011/054046 on Feb. 23, 2011, now abandoned.

(30) Foreign Application Priority Data

Apr. 30, 2010    (JP) .................................. 2010-105659

(51) Int. Cl.
*H01L 31/00*    (2006.01)
*H01L 29/786*    (2006.01)
*G02F 1/1333*    (2006.01)
*H01L 27/12*    (2006.01)
(Continued)

(52) U.S. Cl.
CPC ...... *H01L 29/78663* (2013.01); *G02F 1/13338* (2013.01); *G02F 1/13624* (2013.01);
(Continued)

(58) Field of Classification Search
CPC ............ H01L 27/1222; H01L 27/1251; H01L 27/1225; H01L 29/7869; H01L 27/14; H01L 27/12; H01L 29/78663; H01L 27/124; H01L 27/78633; G02F 1/13338
USPC .................... 257/57, 88, 79, 59, 71, E29.293, 257/E29.296
See application file for complete search history.

(56) References Cited

U.S. PATENT DOCUMENTS 7,046,282 B1 *    5/2006    Zhang ............... H01L 27/14634
                                                        250/208.1
2005/0099551 A1 *    5/2005    Yang ..................... G02F 1/1368
                                                        349/43
(Continued)

FOREIGN PATENT DOCUMENTS

JP          2010-3910 A    1/2010

OTHER PUBLICATIONS

Nishimura et al., "Circuit Board and Display Device", U.S. Appl. No. 13/695,082, filed Dec. 5, 2012.

*Primary Examiner* — Yosef Gebreyesus
(74) *Attorney, Agent, or Firm* — Keating & Bennett, LLP

(57) ABSTRACT

A source and drain electrode layer ($3s/3d$) of an oxide TFT element (3) is formed by a first conductive layer. A gate electrode ($3g$) of the oxide TFT element (3) and a gate electrode ($5g$) of an a-Si TFT element (5) are formed by a single conductive layer, that is, a second conductive layer. A source and drain electrode layer ($5s/5d$) of the a-Si TFT element (5) is formed by a third conductive layer. The third conductive layer is formed above the second conductive layer in a thickness direction in which each conductive layer is stacked on an insulating substrate (2). Further, the first conductive layer is formed below the second conductive layer in the thickness direction. Therefore, it is possible to provide a circuit board that can have an improved degree of integration of transistor elements formed on the insulating substrate.

19 Claims, 15 Drawing Sheets

(51) Int. Cl.
  *H01L 27/02*  (2006.01)
  *G02F 1/1362*  (2006.01)
  *G06F 3/041*  (2006.01)

(52) U.S. Cl.
  CPC .......... *G06F3/0412* (2013.01); *H01L 27/0207* (2013.01); *H01L 27/124* (2013.01); *H01L 27/1222* (2013.01); *H01L 27/1225* (2013.01); *H01L 27/1251* (2013.01); *H01L 29/7869* (2013.01); *H01L 29/78633* (2013.01)

(56) References Cited

U.S. PATENT DOCUMENTS

| | | | |
|---|---|---|---|
| 2005/0176194 A1* | 8/2005 | Sasaki | H01L 21/8221 438/197 |
| 2007/0194316 A1* | 8/2007 | Choi | G09G 3/3225 257/69 |
| 2009/0160741 A1* | 6/2009 | Inoue et al. | 345/76 |
| 2009/0242992 A1* | 10/2009 | Kim | H01L 21/823462 257/360 |
| 2009/0294808 A1* | 12/2009 | Ito | H01L 21/67132 257/288 |
| 2010/0171120 A1* | 7/2010 | Gosain et al. | 257/59 |
| 2010/0182223 A1* | 7/2010 | Choi | G09G 3/3233 345/76 |
| 2010/0237352 A1* | 9/2010 | Sele | H01L 27/12 257/66 |
| 2010/0252833 A1* | 10/2010 | Liu | H01L 27/12 257/59 |
| 2011/0012104 A1* | 1/2011 | Kang et al. | 257/43 |
| 2011/0012106 A1* | 1/2011 | Yamazaki et al. | 257/43 |
| 2011/0024755 A1* | 2/2011 | Korenari | H01L 27/1214 257/59 |
| 2011/0079784 A1* | 4/2011 | Im | 257/59 |
| 2012/0162053 A1* | 6/2012 | Lee et al. | 345/80 |

* cited by examiner

F I G. 6
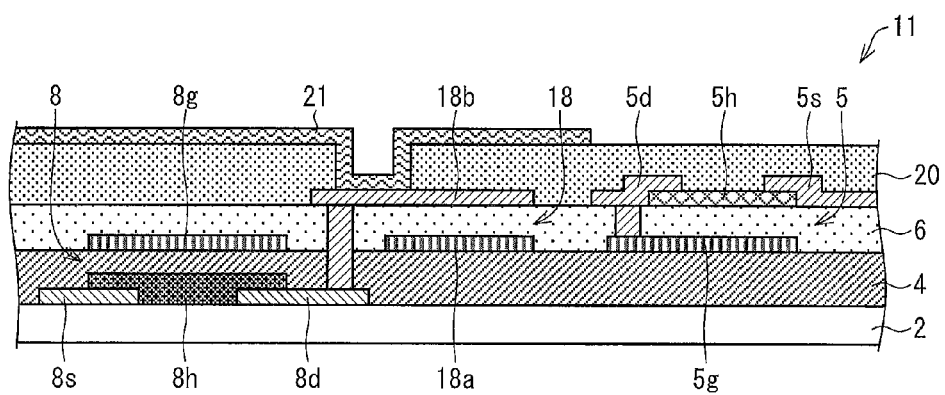

F I G. 8
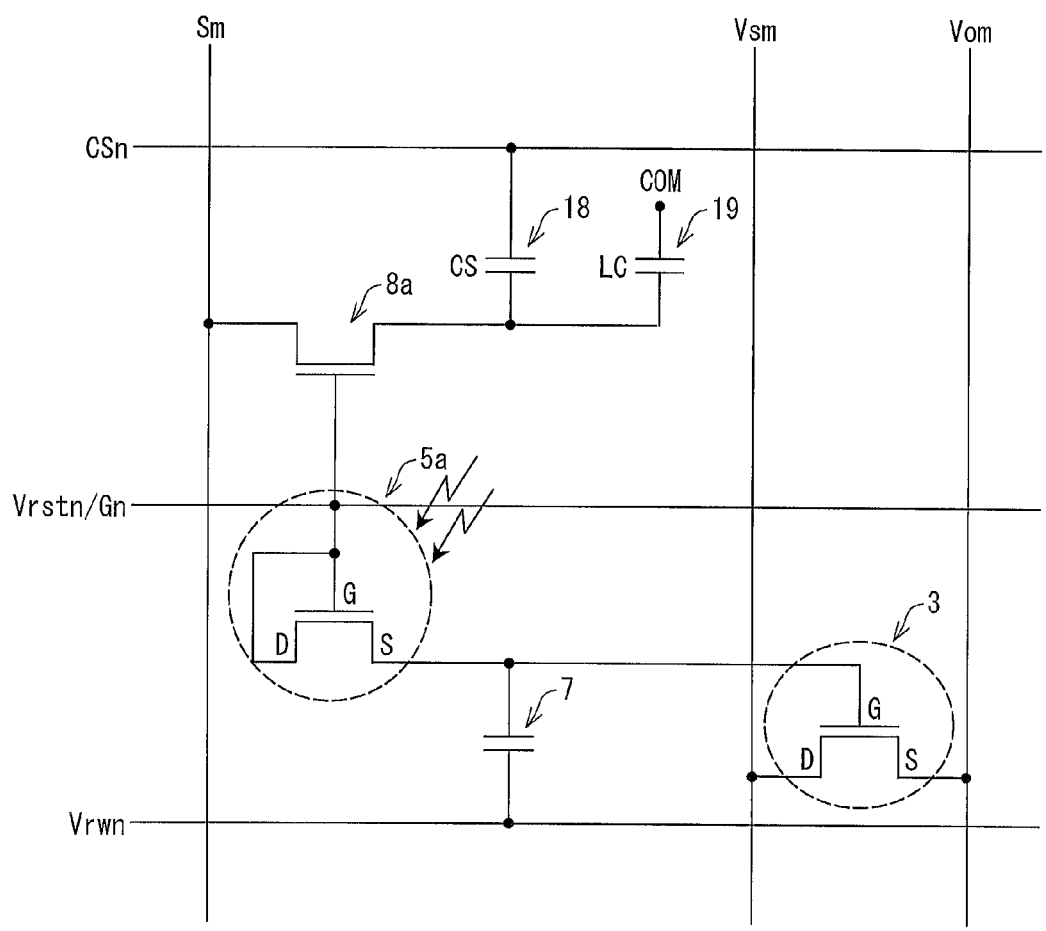

F I G. 1 7
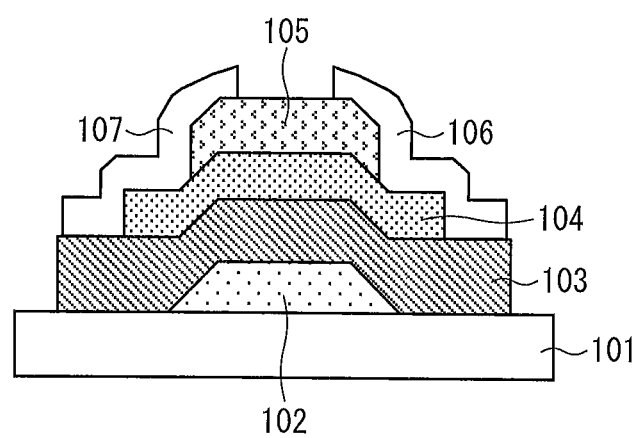

CIRCUIT BOARD AND DISPLAY DEVICE

TECHNICAL FIELD

The present invention relates to a circuit board in which a transistor element (thin film transistor) is formed and a display device including the circuit board.

BACKGROUND ART

A thin film transistor (hereinafter, referred to as a TFT) has been used in various applications such as (i) a circuit element that manages switching of an element of a liquid crystal display device (LCD) or (ii) a circuit element that constitutes a driver of an LCD. In recent years, for providing a large-size screen, a high definition, and improvement in performance such as a high frame rate, and the like each of which is required in the LCD, TFTs have been increasingly demanded to have high performance and high reliability.

In pursuit of such high performance and high reliability of TFTs, kinds of TFTs are diversified in accordance with kinds of semiconductors each of which can be used for constituting a channel layer. For monocrystalline silicon TFTs, amorphous silicon (a-Si) TFTs, and polycrystalline silicon (poly-Si) TFTs among the diversified kinds of TFTs, mass production techniques have been established. Meanwhile, research and development are being actively carried out for microcrystalline silicon (pc-Si) TFTs, oxide TFTs, and organic TFTs.

Patent Literature 1 listed below discloses a configuration of a TFT that employs, as a channel layer, a transparent and conductive oxide semiconductor such as ZnO, and a method of producing such a TFT. Patent Literature 1 describes that because a film of such an oxide semiconductor can be formed at a low temperature and the oxide semiconductor is transparent with respect to visible light, it is possible to form a flexible transparent TFT on a substrate such as a plastic plate or a film by using the oxide semiconductor.

FIG. 17 is a cross sectional view showing a structure of a conventional bottom gate (inversely staggered) TFT. This TFT is configured by first providing a gate electrode 102 on a substrate 101 and then providing, above the gate electrode 102, a first insulating film 103, an oxide semiconductor layer 104 serving as a channel layer, a second insulating film 105 functioning as an etching stopping layer, a source electrode 106 and a drain electrode 107.

In a case where amorphous oxide containing In, Zn, and O is used as the oxide semiconductor layer 104, the oxide semiconductor layer 104 can be produced at a room temperature. Accordingly, by employing a sputtering method for formation of an insulating film, all film forming processes can be performed at a room temperature. Further, in such a case where the amorphous oxide is employed as the oxide semiconductor layer 104, a plastic substrate, a plastic film, or the like can be used as the substrate.

Furthermore, because the second insulating layer 105 is protecting a channel region, the source electrode 106 and the drain electrode 107 can be formed by patterning not only by means of dry etching but also by means of wet etching. This is described in Patent Literature 1.

Note that Patent Literature 2 listed below discloses a 1-transistor light sensor circuit described later as an embodiment.

CITATION LIST

Patent Literature

[Patent Literature 1] Japanese Patent Application Publication, Tokukai, No. 2008-166716 (Publication Date: Jul. 17, 2008)

[Patent Literature 2] International Application Publication No. WO2007/145347 (Publication Date: Dec. 21, 2007)

[Patent Literature 3] International Application Publication No. WO2009/025120 (Publication Date: Feb. 26, 2009)

SUMMARY OF INVENTION

Technical Problem

However, conventionally, for example, in a case where a bottom gate TFT is formed as shown in FIG. 17, the gate electrode 102 is generally formed by using a conductive layer that is different from a conductive layer used for forming a pair of the source electrode 106 and the drain electrode 107. In other words, the gate electrode 102, and the pair of the source electrode 106 and the drain electrode 107 are formed generally by using two kinds of conductive layers. Similarly, even in a case where a plurality of TFTs are provided on a single insulating substrate, the gate electrode 102, and the pair of the source electrode 106 and the drain electrode 107 of each of the plurality of TFTs are generally formed by using two kinds of conductive layers.

Note that though the above description discusses an example case where a bottom gate TFT is formed, the same applies to a case where a top gate TFT is formed.

In such a conventional configuration as described above, the plurality of TFTs formed on a single insulating substrate cannot be overlapped when viewed from above. As a result, an area for formation of the plurality of TFTs becomes large on the insulating substrate. This consequently makes it difficult to increase a degree of integration of the plurality of TFTs that are formed on the insulating substrate.

The present invention is attained in view of the above problems. An object of the present invention is to provide a circuit board that makes it possible to improve a degree of integration of transistor elements formed on an insulating substrate, and a display device including the circuit board.

Solution to Problem

For solving the above problem, a circuit board of the present invention includes: a first transistor element including a first semiconductor layer serving as a channel layer; a second transistor element including a second semiconductor layer serving as a channel layer; and a first conductive layer, a second conductive layer and a third conductive layer as electrode formative layers by which the first transistor element and the second transistor element are formed, the first transistor element and the second transistor element being provided on one surface of a single insulating substrate, the first conductive layer forming one of a gate electrode and a pair of source and drain electrodes of the first transistor element, the third conductive layer forming one of a gate electrode and a pair of source and drain electrodes of the second transistor element, the second conductive layer forming both of (a) the other one of the gate electrode and the pair of source and drain electrodes of the first transistor element and (b) the other one of the gate electrode and the pair of source and drain electrodes of the second transistor element, one of the first conductive layer and the third conductive layer being formed above the second conductive layer in a thickness direction in which the first conductive layer, the second conductive layer, and the third conductive layer are stacked on the insulating substrate, the other one of the first conductive layer and the third conductive layer being formed below the second conductive layer in the thickness direction in which the first conductive layer, the second conductive layer, and the third conductive layer are stacked on the insulating substrate.

Conventionally, a gate electrode and a pair of source and drain electrodes that are provided in a transistor element are formed generally by using different conductive layers, that is, two kinds of conductive layers, respectively. Even in a case where a plurality of transistor elements are provided on a single insulating substrate, a gate electrode and a pair of source and drain electrodes in each of the plurality of transistor elements are formed generally by using two kinds of conductive layers, respectively.

However, in the conventional configuration as described above, a plurality of transistor elements formed on a single insulating substrate cannot be overlapped when viewed from above. As a result, a formation area where the plurality of transistor elements are formed becomes large on the insulating substrate. This has conventionally made it difficult to provide a circuit board that has a high degree of integration.

On the other hand, in the configuration of the present invention, electrodes that are provided in the first transistor element and the second transistor element are formed by using the first conductive layer, the second conductive layer, and the third conductive layer.

In a case where electrodes that are provided in the first transistor element and the second transistor element are formed as described above by using three kinds of conductive layers, the first transistor element and the second transistor element can be arranged to partially overlap each other when viewed from above. As a result, a formation area where the transistor elements are formed on the insulating substrate can be reduced. This consequently makes it possible to provide a circuit board that has a high degree of integration.

For solving the above problem, a display device of the present invention includes the circuit board.

With the above configuration, it is possible to provide a display device that is bright and that has a low power consumption.

Advantageous Effects of Invention

As described above, the circuit board of the present invention is configured to include: a first conductive layer, a second conductive layer and a third conductive layer as electrode formative layers by which the first transistor element and the second transistor element are formed, the first conductive layer forming one of a gate electrode and a pair of source and drain electrodes of the first transistor element, the third conductive layer forming one of a gate electrode and a pair of source and drain electrodes of the second transistor element, the second conductive layer forming both of (a) the other one of the gate electrode and the pair of source and drain electrodes of the first transistor element and (b) the other one of the gate electrode and the pair of source and drain electrodes of the second transistor element, one of the first conductive layer and the third conductive layer being formed above the second conductive layer in a thickness direction in which the first conductive layer, the second conductive layer, and the third conductive layer are stacked on the insulating substrate, the other one of the first conductive layer and the third conductive layer being formed below the second conductive layer in the thickness direction in which the first conductive layer, the second conductive layer, and the third conductive layer are stacked on the insulating substrate.

Moreover, as described above, the display device of the present invention is configured to include the circuit board.

Therefore, it becomes possible to provide a circuit board which makes it possible to improve a degree of integration of transistor elements that are formed on an insulating substrate. In addition, it becomes possible to provide a display device that is bright and that has a low power consumption.

BRIEF DESCRIPTION OF DRAWINGS

FIG. 6 is a cross sectional view illustrating a configuration of a first TFT element serving as a switching element provided in each pixel of the TFT substrate of the present invention.

FIG. 8 is a circuit diagram showing a circuit configuration of 1 (one) pixel of a TFT substrate in accordance with another embodiment of the present invention.

FIG. 17 is a cross sectional view showing a structure of a conventional bottom gate (inversely staggered) TFT.

DESCRIPTION OF EMBODIMENTS

Embodiment 1

The following description will discuss one embodiment of the present invention with reference drawings. Note that dimensions, materials, shapes and relative positions, etc. of components, described in Embodiment 1, are illustrative only and are not intended to limit the scope of the present invention to them unless otherwise noted.

(Basic Configuration of Circuit Board)

Figure 1:
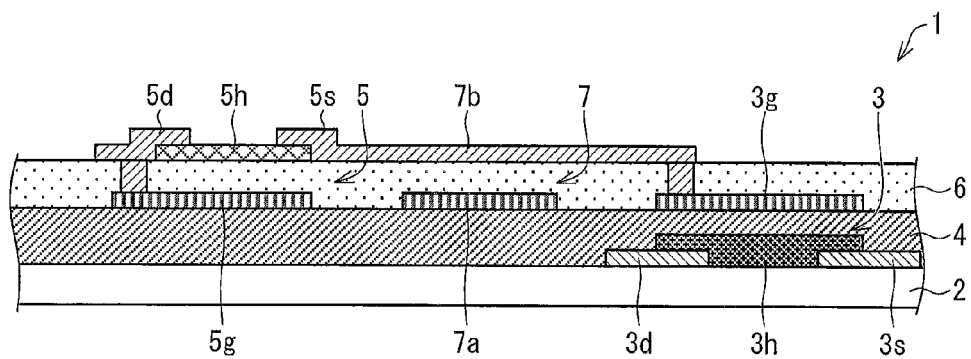
FIG. 1 is a cross sectional view schematically illustrating a basic configuration of a circuit board of the present invention.

First, with reference to FIG. 1, the following description will discuss a basic configuration of a circuit board 1 of the present invention. FIG. 1 is a cross sectional view schematically illustrating a basic configuration of the circuit board 1.

As illustrated in FIG. 1, the circuit board 1 is configured to include a first TFT element 3 (first transistor element) formed in a top gate type configuration and a second TFT element 5 (second transistor element) formed in a bottom gate type configuration. Both the first TFT element 3 and the second TFT element 5 are formed on a single insulating substrate 2.

Further, a gate electrode 3g of the first TFT element 3 and a gate electrode 5g of the second TFT element 5 are formed by a single conductive layer (second conductive layer).

The first TFT element 3 includes an oxide semiconductor layer 3h (first semiconductor layer) serving as a channel layer (also called an active layer).

Embodiment 1 employs, as the oxide semiconductor layer 3h, an amorphous oxide semiconductor layer that contains at least one element selected from a group consisting of In, Ga, and Zn. Embodiment 1 is, however, not limited to this, but can employ, as the oxide semiconductor layer 3h, for example a polycrystalline material such as zinc oxide (ZnO).

As described above, the first TFT element 3 includes the oxide semiconductor layer 3h serving as a channel layer. Accordingly, the first TFT element 3 can have a relatively high mobility (that is approximately 20 times as high as that of the second TFT element 5) without increasing a size of the first TFT element 3. However, the first TFT element 3 has a characteristic in which its sensitivity to light is low.

On the other hand, the second TFT element 5 includes a hydrogenated amorphous silicon layer (a-Si:H) 5h (second semiconductor layer) serving as a channel layer. Therefore, the TFT element 5 can have a relatively high sensitivity to light (particularly with respect to visible light). However, the TFT element 5 has a low mobility.

Hereinafter, the first TFT element 3 is referred to as an oxide TFT element 3, and the second TFT element 5 is referred to as an a-Si TFT element 5.

According to the above circuit board 1, the oxide TFT element 3 and the a-Si TFT element 5 are formed on the single insulating substrate 2. The oxide TFT element 3 and the a-Si TFT element 5 have different characteristics as described above.

With the configuration, the gate electrode 3g of the oxide TFT element 3 and the gate electrode 5g of the a-Si TFT element 5 are formed by the single conductive layer. Therefore, the gate electrode 3g and the gate electrode 5g can be formed in a single step of forming the conductive layer.

It is therefore possible to provide a circuit board 1 in which an oxide TFT element 3 and an a-Si TFT element 5, having different characteristics, are formed on a single insulating substrate 2 in a relatively simplified production process.

Though, in Embodiment 1, the hydrogenated amorphous silicon layer (a-Si:H) 5h is employed as the channel layer of the second TFT element 5, the channel layer is not limited to such a specific one, provided that it has a relatively high sensitivity to light. For example, the channel layer can be a semiconductor layer that includes a microcrystalline silicon layer.

(Detailed Configuration of Each TFT Element)

The following description will discuss in detail how the oxide TFT element 3 and the a-Si TFT element 5 are configured, with reference to FIG. 1.

As illustrated in FIG. 1, the oxide TFT element 3 is formed in a top gate type configuration. Specifically, according to the oxide TFT element 3, the gate electrode 3g is formed above the oxide semiconductor layer 3h via a first gate insulating layer 4 (first insulating layer). The gate electrode 3g is formed to be above a source and drain electrode layer 3s/3d (first conductive layer) that is electrically connected to the oxide semiconductor layer 3h. Note that the source and drain electrode layer 3s/3d is a layer by which a source electrode 3s and a drain electrode 3d of the oxide TFT element 3 are formed.

On the other hand, the a-Si TFT element 5 is formed in a bottom gate type configuration. Specifically, according to the a-Si TFT element 5, the gate electrode 5g and the gate electrode 3g of the oxide TFT element 3 are formed by a single conductive layer. This gate electrode 5g is provided below a source and drain electrode layer 5s/5d (third conductive layer) that is electrically connected to the hydrogenated amorphous silicon layer 5h. This hydrogenated amorphous silicon layer 5h is formed above the gate electrode 5g via a second gate insulating layer 6 (second insulating layer). Note that the source and drain electrode layer 5s/5d is a layer by which a source electrode 5s and a drain electrode 5d of the a-Si TFT element 5 are formed.

Note that the hydrogenated amorphous silicon layer 5h provided in the a-Si TFT element 5 is obtained by hydrotreating, with the use of a large amount of hydrogen, a large number of dangling bonds (nonbonding electrons) present in an amorphous silicon layer.

In the hydrogenated amorphous silicon layer 5h, a large amount of hydrogen remains. In a case where the oxide semiconductor layer 3h of the oxide TFT element 3 is formed so as to be in contact with the hydrogenated amorphous silicon layer 5h in a production process or in a final product, hydrogen in the hydrogenated amorphous silicon layer 5h can adversely affect the oxide semiconductor layer 3h. This can cause a deterioration in element characteristics of the oxide TFT element 3.

Figure 18:
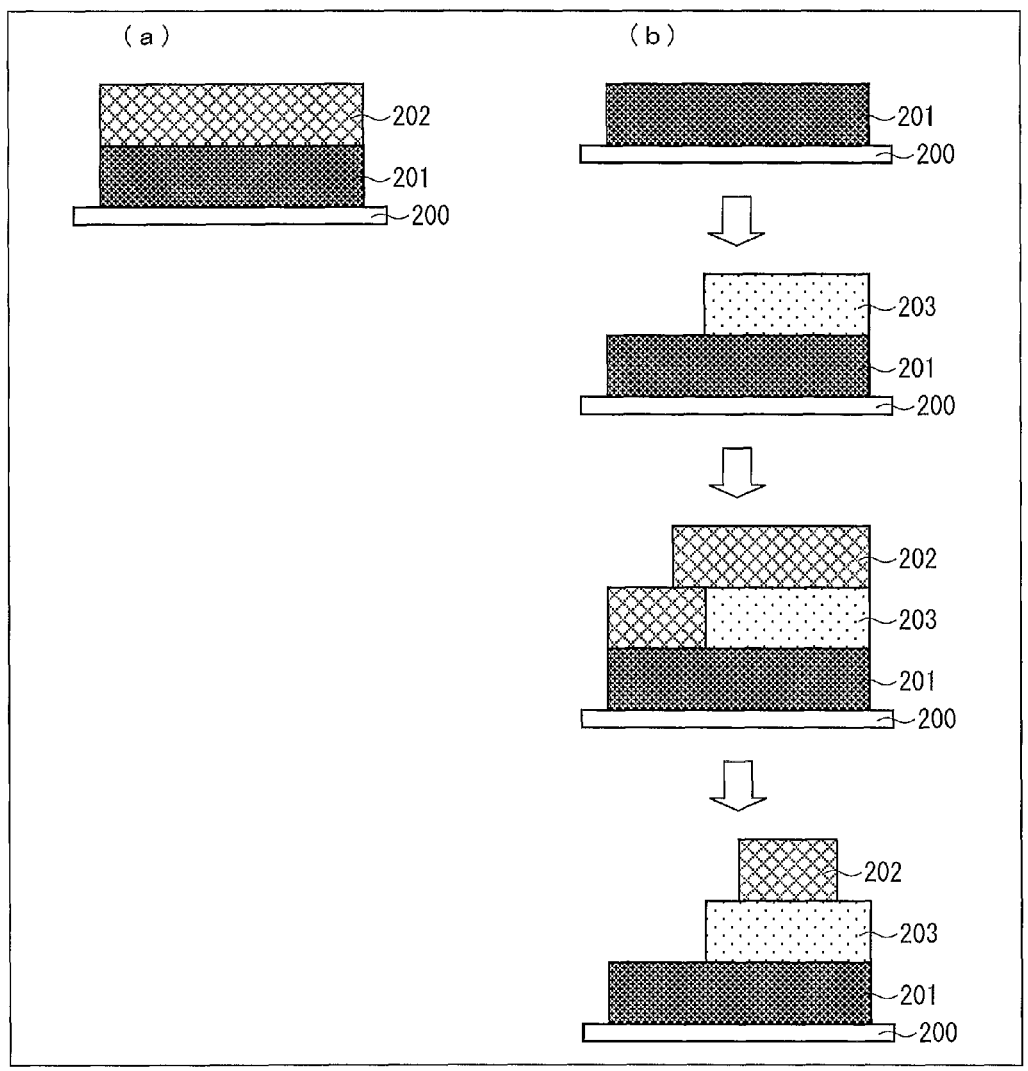
FIG. 18 is a diagram illustrating an example case where an oxide semiconductor layer and a hydrogenated amorphous silicon layer are formed on an insulating substrate so as to come in contact with each other.

The following description will discuss, in detail, a case where hydrogen in a hydrogenated amorphous silicon layer adversely affects an oxide semiconductor layer, with reference to FIG. 18.

FIG. 18 is a diagram illustrating an example case where an oxide semiconductor layer 201 and a hydrogenated amorphous silicon layer 202 are formed on an insulating substrate 200 so as to come in contact with each other.

(a) of FIG. 18 illustrates a case where the hydrogenated amorphous silicon layer 202 is formed on the oxide semiconductor layer 201 so that the oxide semiconductor layer 201 and the hydrogenated amorphous silicon layer 202 come in direct contact with each other in a final product.

(b) of FIG. 18 illustrates a case where the oxide semiconductor layer 201 and the hydrogenated amorphous silicon layer 202 are not in direct contact with each other in a final product but come in direct contact with each other in a production process.

As illustrated in (b) of FIG. 18, the oxide semiconductor layer 201 is first formed on a single insulating substrate 200. Then, a separation layer 203 is formed on a part (a region where the hydrogenated amorphous silicon layer 202 is to be formed in a subsequent step) of a top surface of the oxide semiconductor layer 201. The separation layer 203 separates the oxide semiconductor layer 201 and the hydrogenated amorphous silicon layer 202 that is to be formed in the subsequent step.

Subsequently, on an entire surface above the insulating substrate 200, an amorphous silicon layer is deposited so as to cover the oxide semiconductor layer 201 and the separation layer 203. The amorphous silicon layer will subsequently be the hydrogenated amorphous silicon layer 202 through a hydrotreating process. Then, the hydrotreating process causes the amorphous silicon layer to be transformed into the hydrogenated amorphous silicon layer 202. On the hydrogenated amorphous silicon layer 202, a resist (not shown) of a predetermined pattern is formed. Subsequently, the hydrogenated amorphous silicon layer 202 is etched while using the resist as a mask. As a result, the hydrogenated amorphous silicon layer 202 is formed so as to have the predetermined pattern.

As described above, in the production process as shown in (b) of FIG. 18, the oxide semiconductor layer 201 and the hydrogenated amorphous silicon layer 202 are not in direct contact with each other in a final product, but the oxide semiconductor layer 201 come into direct contact with each other in the production process.

In both cases of (a) and (b) of FIG. 18, hydrogen in the hydrogenated amorphous silicon layer 202 can adversely affect the oxide semiconductor layer 201, and can ultimately cause a deterioration in element characteristics of the oxide TFT.

As described above, a large amount of hydrogen remains in the hydrogenated amorphous silicon layer 5h as illustrated in FIG. 1. Accordingly, in a case where the oxide semiconductor layer 3h is formed so as to be adjacent to the hydrogenated amorphous silicon layer 5h in the production process or in a final production, hydrogen in the hydrogenated amorphous silicon layer 5h can adversely affect the oxide semiconductor layer 3h. This can cause a deterioration in element characteristics of the oxide TFT element 3 that includes the oxide semiconductor layer 3h serving as a channel layer.

According to the configuration of the oxide TFT element 3 and the a-Si TFT element 5 that are formed in the circuit board 1 (see FIG. 1), the first gate insulating layer 4, the second gate insulating layer 6, and a formative layer, by which the gate electrode 3g and the gate electrode 5g are formed, are present between (i) the oxide semiconductor layer 3h that is formed in the oxide TFT element 3 and (ii) the hydrogenated amorphous silicon layer 5h that is formed in the a-Si TFT element 5. It follows that the configuration is capable of preventing the hydrogen in the hydrogenated amorphous silicon layer 5h from adversely affecting the oxide semiconductor layer 3h, in the production process and in the final production.

Therefore, with the configuration, it is possible to provide a circuit board 1 in which (a) an oxide TFT element 3 that has a relatively high mobility and an a-Si TFT element 5 that has a relatively high sensitivity to light can be formed on a single insulating substrate 2 in a relatively simplified production process and (b) a deterioration in element characteristics of the oxide TFT element 3 that includes the oxide semiconductor layer 3h can be prevented.

The circuit board 1 as illustrated in FIG. 1 further includes a capacitor element 7. The capacitor element 7 is formed by a capacitor electrode 7a, a capacitor counter electrode 7b, and the second gate insulating layer 6. The capacitor electrode 7a is formed by the formative layer, by which the gate electrode 3g and the gate electrode 5g are formed. The capacitor counter electrode 7b is formed by the source and drain electrode layer 5s/5d so that the capacitor counter electrode 7b and the capacitor electrode 7a overlap each other when viewed from above.

Note that, according to Embodiment 1, the capacitor element 7 is formed by (a) the formative layer by which the gate electrode 3g and the gate electrode 5g are formed, (b) the source and drain electrode layer 5s/5d, and (c) the second gate insulating layer 6 but Embodiment 1 is not limited to this. Alternatively, the capacitor element can be formed by (a) the formative layer by which the gate electrode 3g and the gate electrode 5g are formed, (b) the source and drain electrode layer 3s/3d, and (c) the first gate insulating layer 4.

With the configuration, it is possible to prepare the circuit board 1 that includes the oxide TFT element 3, the a-Si TFT element 5, and the capacitor element 7, without any additional production process for incorporating the capacitor element 7 into the circuit board 1.

The following description will discuss a case where the circuit board 1, which includes the oxide TFT element 3, the a-Si TFT element 5, and the capacitor element 7, are used as a light sensor circuit.

Note that a combination of the oxide TFT element 3 and the a-Si TFT element 5 and a combination of the oxide TFT element 3, the a-Si TFT element 5, and the capacitor element 7, components in each of combinations being included in the circuit board 1, can certainly be applied to an application other than the light sensor circuit.

(Application of Circuit Board—Light Sensor Circuit)

Figure 2:
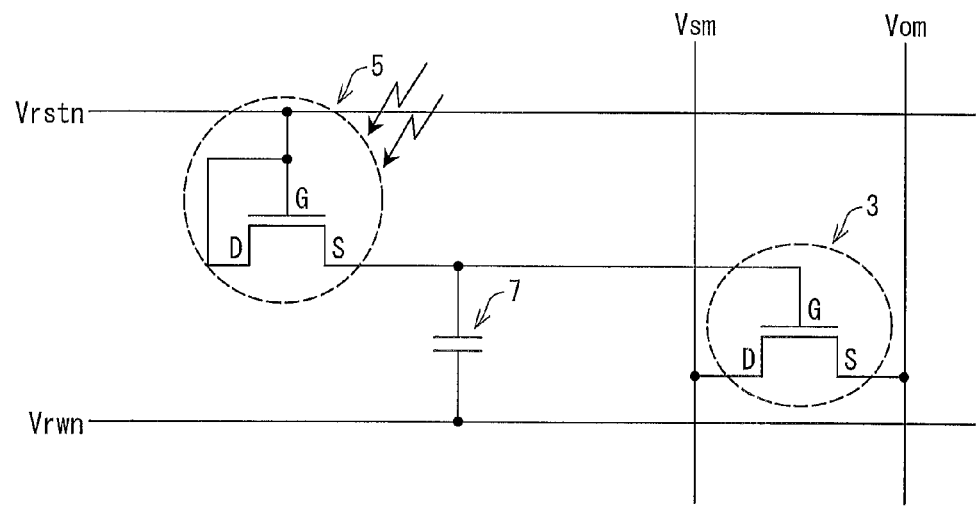
FIG. 2 is a circuit diagram showing a circuit configuration of a light sensor circuit that is an application of the circuit board of the present invention.

FIG. 2 is a circuit diagram showing a circuit configuration of a light sensor circuit that is an application of the circuit board 1.

As shown in FIG. 2, the light sensor circuit is composed of the oxide TFT element 3, the a-Si TFT element 5, and the capacitor element 7. The oxide TFT element 3 serves as a sensor output (output amplifier) of the light sensor circuit. The a-Si TFT element 5 serves as a light sensor element of the light sensor circuit. The capacitor element 7 serves as a step-up condenser of the light sensor circuit.

More specifically, the light sensor circuit is realized by a 1T (abbreviation of a transistor) circuit which employs only one transistor that serves as a sensor output. The oxide TFT element 3 functions as a source follower transistor (voltage follower transistor). The oxide TFT element 3 has (i) a drain D connected to an AMP power supply bus line Vsm (where m is a natural number indicating a column number of the bus line) and (ii) a source S connected to a light sensor output bus line Vom.

The AMP power supply bus line Vsm and the light sensor output bus line Vom are connected to a sensor reading circuit 15 that is explained later and shown in FIG. 4. A power supply voltage VDD is applied from the sensor reading circuit 15, via the AMP power supply bus line Vsm.

The gate electrode G (base) of the oxide TFT element 3 is connected to (i) a source S of the a-Si TFT element 5 that serves as a photodiode and (ii) one electrode of the capacitor element 7 that serves as the step-up condenser.

Note that the drain electrode 5d of the a-Si TFT element 5 and the gate electrode 5g are short-circuited (see FIG. 1). In other words, the a-Si TFT element 5 is a diode-connected transistor. The a-Si TFT element 5 thus functions as a photodiode in which the source electrode 5s serves as a cathode and the drain electrode 5d serves as an anode.

As shown in FIG. 2, the a-Si TFT element 5 has a drain D connected to a photodiode-resetting line Vrstn (where n is a natural number indicating a row number of the photodiode-resetting line). Through the photodiode-resetting line Vrstn, a reset signal RST is supplied from a sensor scan signal line drive circuit 14 (later described) illustrated in FIG. 4. The other electrode of the capacitor element 7 is connected to a line Vrwn for selecting a light sensor row. Through the line Vrwn, a light sensor row selecting signal RWS is supplied. Note that the light sensor row selecting signal RWS has (i) a function to select a specific row of light sensor circuits that are arranged in a matrix manner and (ii) a function to cause a light sensor circuit on thus selected specific line to output a detection signal.

With the above configuration, the oxide TFT element 3 can provide a high output voltage without increasing a size of the TFT element 3. However, the TFT element 3 has a characteristic in which its sensitivity to light is low. Therefore, the oxide TFT element 3 suitably serves as a sensor output of the light sensor circuit.

On the other hand, the a-Si TFT element 5 has a high sensitivity to light. However, since the a-Si TFT element 5 has a low mobility, an output voltage of the a-Si TFT element 5 is low. Therefore, the a-Si TFT element 5 suitably serves as a light sensor element of the light sensor circuit. Note that the light sensor element is required to be sensitive to a waveband of any one of an ultraviolet region, a visible light region, and an infrared region. Note that the hydrogenated amorphous silicon layer 5$h$ (a-Si:H) has (i) a peak of sensitivity in a range of approximately 500 nm to 600 nm and (ii) a favorable sensitivity substantially all over the visible light region.

Accordingly, the above configuration employs (i) as an output amplifier of the light sensor circuit, the oxide TFT element that allows obtaining a high output voltage without increasing a size of the channel layer and (ii) as a light sensor element of the light sensor circuit, the a-Si TFT element 5 that has a relatively high sensitivity to light. It is therefore possible to provide a circuit board 1 employing a small-size high-performance light sensor circuit having a high SN ratio.

On the other hand, a conventional circuit board including only the a-Si TFT element 5 can be used as a circuit board of a light sensor but has a problem that a mobility of the a-Si TFT element 5 is not at a satisfactory level.

Further, though a conventional circuit board including only the oxide TFT element 3 has a satisfactory mobility, such a circuit board cannot be used as the light sensor circuit board.

In a case where the oxide TFT element 3 and the a-Si TFT element 5 are to be provided in a single circuit board, the oxide semiconductor layer provided in the oxide TFT element is formed in adjacent to the hydrogenated amorphous silicon layer provided in the a-Si TFT element 5, in a production process or the like. As a result, hydrogen in the hydrogenated amorphous silicon layer can adversely affect the oxide semiconductor layer. This will ultimately cause a deterioration in element characteristics of the oxide TFT element 3 that includes the oxide semiconductor layer serving as a channel layer.

(Structure of Other TFT Element that can be Formed in Circuit Board)

Embodiment 1 discusses an example case where the circuit board 1 is employed as a light sensor circuit board. This circuit board 1 includes: the oxide TFT element 3 formed in a top gate type configuration; the a-Si TFT element 5 formed in a bottom gate type configuration; and the capacitor element 7. In the circuit board 1, the source and drain electrode layer 3$s$/3$d$ of the oxide TFT element 3 is formed by the first conductive layer; the gate electrode 3$g$ of the oxide TFT element 3 and the gate electrode 5$g$ of the a-Si TFT element 5 are formed by a single conductive layer, that is, the second conductive layer; and the source and drain electrode layer 5$s$/5$d$ of the a-Si TFT element 5 is formed by the third conductive layer. Embodiment 1 is, however, not limited to this.

Figure 3:
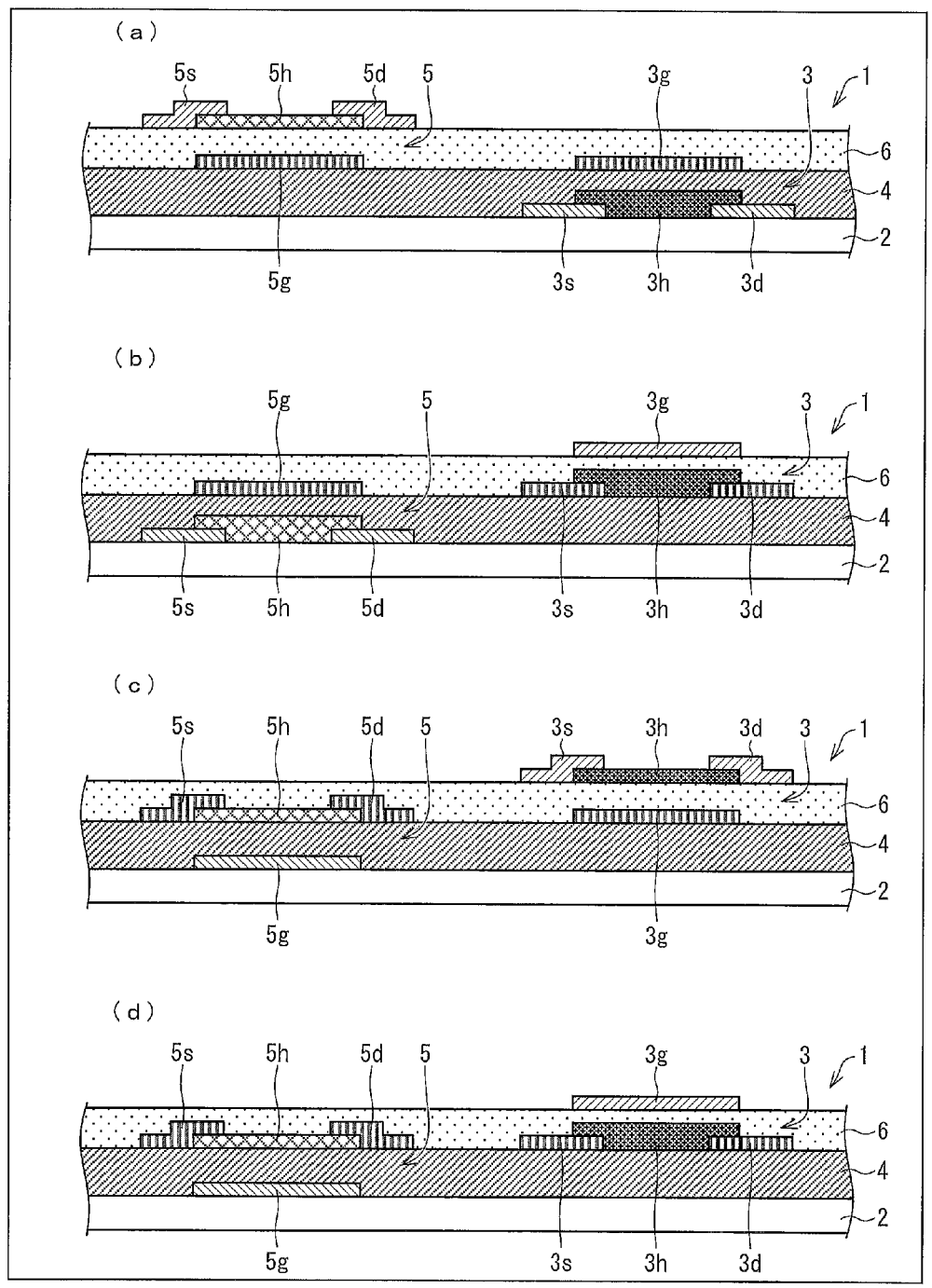
FIG. 3 is a diagram showing another example structure of TFT elements provided in the circuit board of the present invention.

FIG. 3 is a diagram showing another example structure of the oxide TFT element 3 and the a-Si TFT element 5 each of which is provided in the circuit board of the present invention.

Note that the third conductive layer is formed above the second conductive layer in a thickness direction (top to bottom or bottom to top direction in FIG. 3) in which each conductive layer is stacked on the insulating substrate 2. Note also that the first conductive layer is formed below the second conductive layer in the thickness direction.

(a) of FIG. 3 illustrates a circuit board 1 including: the oxide TFT element 3 formed in a top gate type configuration; and the a-Si TFT element 5 formed in the bottom gate type configuration. In the circuit board 1, the source and drain electrode layer 3$s$/3$d$ of the oxide TFT element 3 is formed by the first conductive layer; the gate electrode 3$g$ of the oxide TFT element 3 and the gate electrode 5$g$ of the a-Si TFT element 5 are formed by a single conductive layer, that is, the second conductive layer; and the source and drain electrode layer 5$s$/5$d$ of the a-Si TFT element 5 is formed by the third conductive layer.

With the configuration, it is possible to arrange the gate electrode 3$g$ of the oxide TFT element 3 and the gate electrode 5$g$ of the a-Si TFT element 5 to be a single common electrode. It is therefore possible to reduce the number of lines required for driving the oxide TFT element 3 and the a-Si TFT element 5.

Alternatively, by making a size of the oxide TFT element 3 identical to a size of the a-Si TFT element 5, the oxide TFT element 3 and the a-Si TFT element 5 can be configured so as to completely overlap each other when viewed from above.

Alternatively, for example, oxide TFT elements 3 and a-Si TFT elements 5 can be configured so that (i) a size of each of the oxide TFT elements 3 is smaller than a size of each of the a-Si TFT elements 5 and (ii) two or more of the oxide TFT elements 3 and a corresponding one of the a-Si TFT elements 5 overlap each other when viewed from above.

Therefore, it is possible to reduce a formation area where the oxide TFT element(s) 3, the a-Si TFT element(s) 5, and lines for these elements are formed on the insulating substrate 2. This makes it possible to provide a circuit board 1 that has a high degree of integration.

(b) of FIG. 3 illustrates a circuit board 1 including: the oxide TFT element 3 formed in a top gate type configuration; and the a-Si TFT element 5 formed also in a top gate type configuration. In this circuit board 1, the source and drain electrode layer 5$s$/5$d$ of the a-Si TFT element 5 is formed by the first conductive layer; the gate electrode 5$g$ of the a-Si TFT element 5 and the source and drain electrode layer 3$s$/3$d$ of the oxide TFT element 3 are formed by a single conductive layer, that is, the second conductive layer; and the gate electrode 3$g$ of the oxide TFT element 3 is formed by the third conductive layer.

With the above configuration, for example, in a circuit in which the gate electrode 5$g$ of the a-Si TFT element 5 is electrically connected to the source electrode 3$s$ of the oxide TFT element 3, it is possible to electrically connect the gate electrode 5$g$ and the source electrode 3$s$, without any contact hole, only by patterning the second conductive layer. This is because the gate electrode 5$g$ and the source electrode 3$s$ are formed by the single conductive layer, that is, the second conductive layer.

With the configuration, the gate electrode 5$g$ and the source electrode 3$s$ can be integrated. This makes it possible to arrange the oxide TFT element 3 and the a-Si TFT element 5 to overlap each other when viewed from above.

Therefore, it becomes possible to reduce a formation area where the oxide TFT element 3 and the a-Si TFT element 5 are formed on the insulating substrate 2. This makes it possible to provide a circuit board 1 that has a high degree of integration.

Meanwhile, (c) of FIG. 3 illustrates a circuit board 1 that includes: the oxide TFT element 3 formed in a bottom gate type configuration; and the a-Si TFT element 5 formed also in a bottom gate type configuration. In the circuit board 1, the gate electrode 5g of the a-Si TFT element 5 is formed by the first conductive layer; the source and drain electrode layer 5s/5d of the a-Si TFT element 5 and the gate electrode 3g of the oxide TFT element 3 are formed by a single conductive layer, that is, the second conductive layer; and the source and drain electrode layer 3s/3d of the oxide TFT element 3 is formed by the third conductive layer.

With the above configuration, for example, in a circuit where the drain electrode 5d of the a-Si TFT element 5 is electrically connected to the gate electrode 3g of the oxide TFT element 3, it is possible to electrically connect the drain electrode 5d and the gate electrode 3g, without any contact hole, only by patterning the second conductive layer. This is because the drain electrode 5d and the gate electrode 3g are formed by the single conductive layer, that is, the second conductive layer.

Further, with the above configuration, the drain electrode 5d and the gate electrode 3g can be integrated. This makes it possible to arrange the oxide TFT element 3 and the a-Si TFT element 5 to overlap each other when viewed from above.

Therefore, it becomes possible to reduce a formation area where the oxide TFT element 3 and the a-Si TFT element 5 are formed on the insulating substrate 2. This makes it possible to provide a circuit board 1 that has a high degree of integration.

(d) of FIG. 3 illustrates a circuit board 1 including: the oxide TFT element 3 formed in a top gate type configuration; and the a-Si TFT element 5 formed in a bottom gate type configuration. In the circuit board 1, the gate electrode 5g of the a-Si TFT element 5 is formed by the first conductive layer; the source and drain electrode layer 5s/5d of the a-Si TFT element 5 and the source and drain electrode layer 3s/3d of the oxide TFT element 3 are formed by a single conductive layer, that is, the second conductive layer; and the gate electrode 3g of the oxide TFT element 3 is formed by the third conductive layer.

(d) of FIG. 3 shows a case where semiconductor layers of the TFT elements 3 and 5 that are provided on the insulating substrate 2 are made of different materials, respectively. However, the semiconductor layers can be formed in a single layer. In such a configuration, the source and drain electrodes 3s, 3d, 5s, and 5d of the TFT element 3 and the TFT element 5 can be formed as common source and drain electrodes. This makes it possible to reduce the number lines required for driving the TFT element 3 and the TFT element 5.

By arranging the source and drain electrodes 3s, 3d, 5s, and 5d of the TFT element 3 and the TFT element 5 to be common source and drain electrodes, the TFT element 3 and the TFT element 5 can be configured so as to partially overlap each other when viewed from above.

This makes it possible to reduce a formation area where the TFT elements 3 and 5 and lines are formed on the insulating substrate 2. This makes it possible to provide a circuit board 1 that has a high degree of integration.

As illustrated in (d) of FIG. 3, the gate electrode 3g is formed above the oxide semiconductor layer 3h of the TFT element 3. The gate electrode 5g is formed below the hydrogenated amorphous silicon layer 5h of the TFT element 5. Accordingly, though not shown, it is possible to provide, in a lower part of the TFT element 3, a light-shielding film that is formed by the same layer as the gate electrode 5g. It is possible to provide, in an upper part of the TFT element 5, a light-shielding film that is formed by the same layer as the gate electrode 3g.

With the configuration, the gate electrodes 3g and 5g and the light-shielding films (not illustrated in (d) of FIG. 3) prevent light from entering the semiconductor layers 3h and 5h from top and bottom directions of the circuit board 1. It is therefore possible to shield such light by using the gate electrodes 3g and 5g and the light-shielding films (not illustrated in (d) of FIG. 3).

Note that, since each of the light-shielding films is formed for the purpose of shielding light, the light-shielding films need not be electrically connected to the respective gate electrodes 3g and 5g.

For example, in a case where the circuit board is employed as an active matrix substrate of a liquid crystal display device, light which enters the semiconductor layer has been conventionally shielded by using, in general, a black matrix. The black matrix is provided on a counter substrate that is provided so as to be opposed to the active matrix substrate. Accordingly, a large margin is required for compensating a displacement that may occur when combining the active matrix substrate and the counter substrate. For this margin, an aperture ratio of the liquid crystal display device has been conventionally decreased.

In contrast, according to the configuration as described above where the light is shielded by using the gate electrodes 3g and 5g and the light shielding layers, alignment becomes possible with the same precision as that in a photo resist process. Accordingly, a large margin becomes unnecessary unlike a conventional configuration. Accordingly, an aperture ratio of a liquid crystal display device can be increased.

Furthermore, according to the above configuration, light can be shielded at a position that is closer to the semiconductor layer. Therefore, the above configuration is excellent in shielding oblique light.

Note that the another structure of the TFT elements, as illustrated in FIG. 3, that can be formed in the circuit board 1 is illustrative only. Other structures other than the another structure can certainly be employed. Furthermore, FIG. 3 exemplifies, as the TFT elements, the oxide TFT element 3 and the a-Si TFT element 5. The TFT elements are, however, not limited to the TFT elements. The TFT elements can be other TFT elements each of which includes other semiconductor layers. In the circuit board 1, semiconductor layers of a plurality of TFT elements can be formed by a single layer.

Embodiment 2

The following description will discuss Embodiment 2 of the present invention, with reference to FIGS. 4 through 7. Embodiment 2 relates to a TFT substrate 11 (active matrix substrate) having a display region R1. In the display region R1, a plurality of pixels that are arranged in a matrix manner is provided. In the plurality of pixels, oxide pixel TFT elements 8 (first TFT element) are provided as switching elements for controlling the respective plurality of pixels to be turned on/off. Furthermore, a light sensor circuit, that includes an oxide TFT element 3, an a-Si TFT element 5, and a capacitor element 7, is provided in each of at least some of the plurality of pixels. Embodiment 2 is different from Embodiment 1 in the above-described points. Other configurations of Embodiment 2 are identical to those described in Embodiment 1. For convenience, members having the same functions as members shown in drawings of Embodiment 1 are given identical reference signs and their explanations are omitted.

(Configuration of Display Device Including Light Sensor Circuit)

Embodiment 2 will exemplify, as a display device, a liquid crystal display device that includes a TFT substrate 11. Embodiment 2 is, however, not limited to this.

Figure 4:
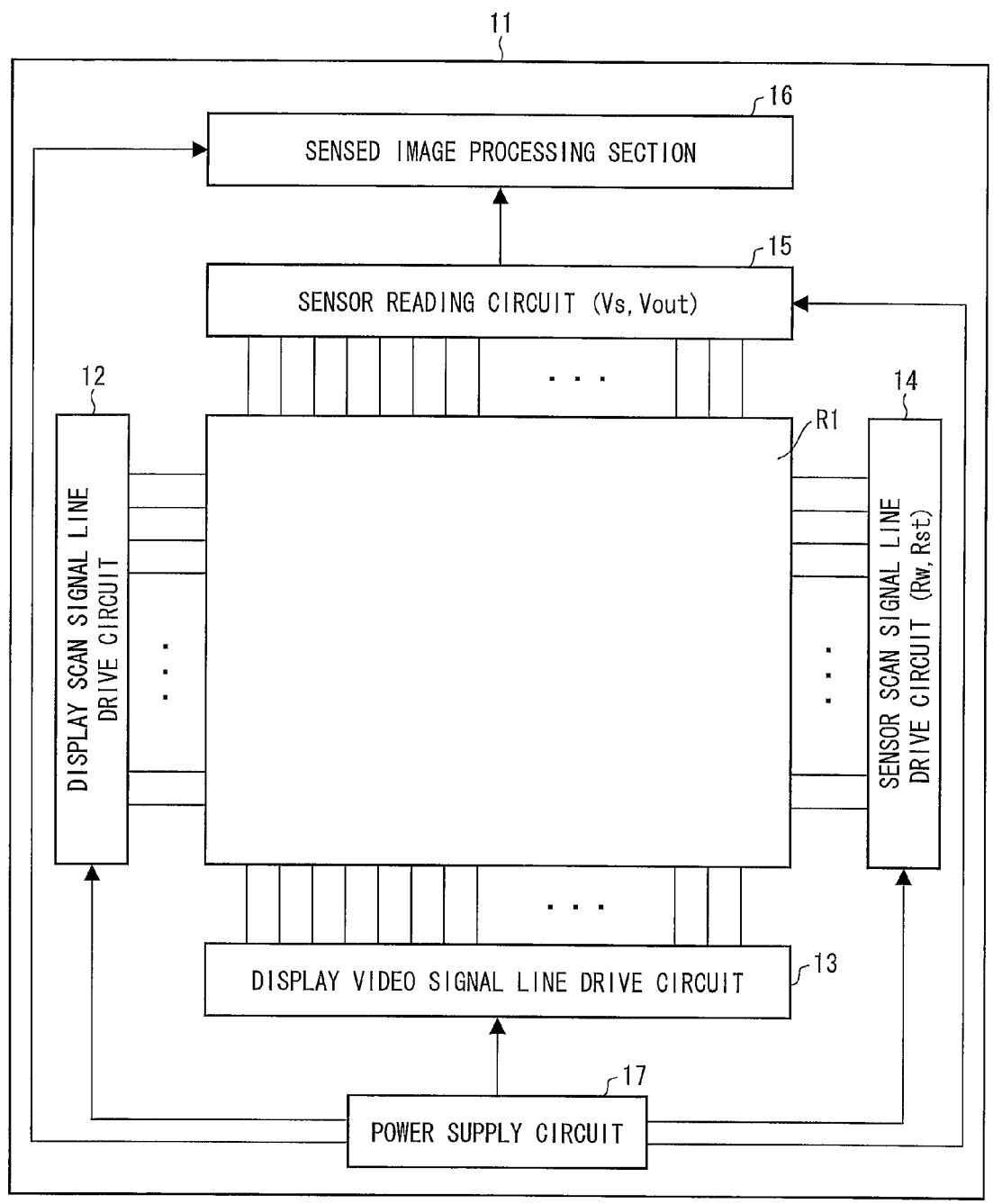
FIG. 4 is a block diagram schematically illustrating a configuration of a TFT substrate of the present invention.

FIG. 4 is a block diagram schematically illustrating a configuration of the TFT substrate 11.

Figure 5:
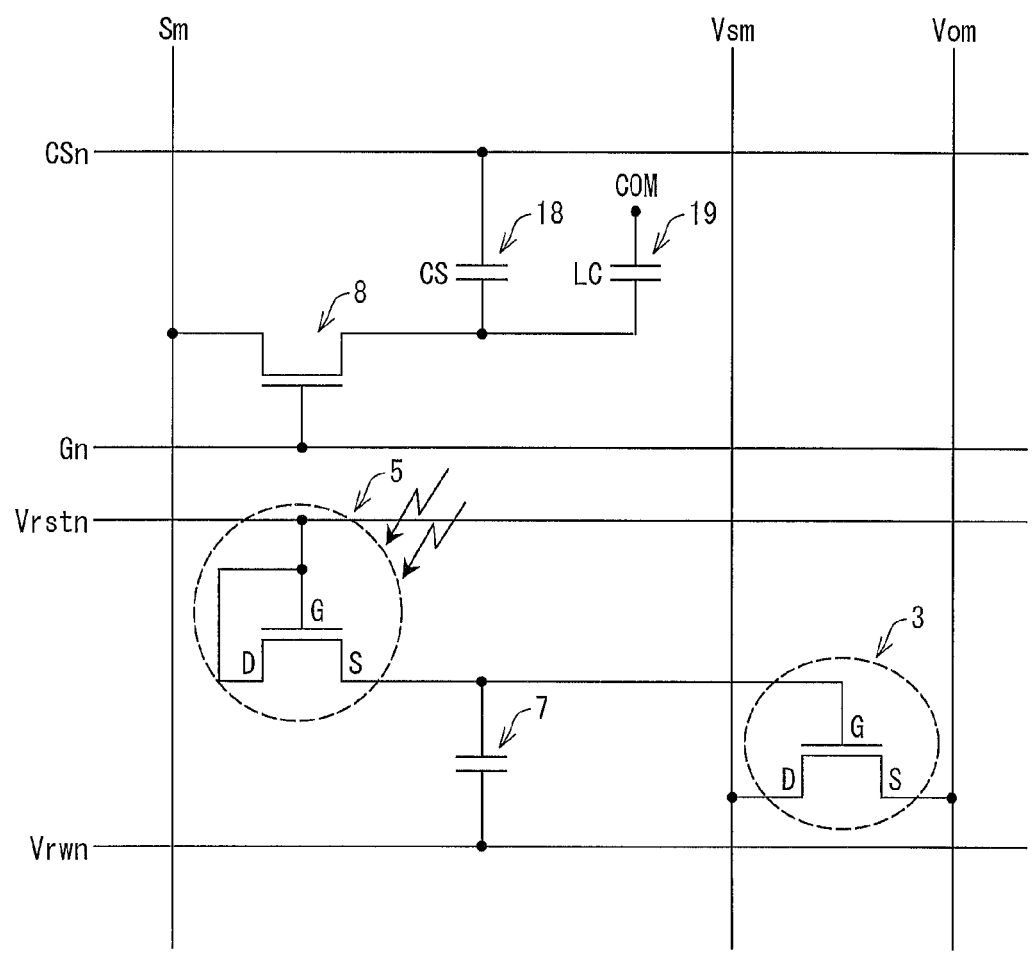
FIG. 5 is a circuit diagram showing a circuit configuration of 1 (one) pixel in a display region of the TFT substrate of the present invention.

FIG. 5 is a circuit diagram of a circuit configuration of 1 (one) pixel in the display region R1 of the TFT substrate 11.

As shown in FIG. 4, the display region R1 is secured in the TFT substrate 11. In the display region R1, a plurality of pixels are provided so as to be arranged in a matrix manner.

As shown in FIG. 5, in a lower part of each of the plurality of pixels, a light sensor circuit is provided. The light sensor circuit includes an oxide TFT element 3, an a-Si TFT element 5, and a capacitor element 7 that are described in Embodiment 1. In an upper part of each of the plurality of pixels (i.e., above a region where the light sensor circuit is provided), a gate line Gn and a source line Sm are provided so as to intersect with each other.

At an intersection between the gate line Gn and the source line Sm, an oxide pixel TFT element 8, an auxiliary capacitor (auxiliary capacitor element) 18, and a pixel electrode are provided. The oxide pixel TFT element 8 serves as a switching element for controlling the each of the plurality of pixels to be turned on/off. The auxiliary capacitor (auxiliary capacitor element) 18 is electrically connected to a drain electrode of the oxide pixel TFT element 8. Further, the pixel electrode is used to form a liquid crystal capacitor 19. Note that the auxiliary capacitor 18 in each of the plurality of pixels is connected to an auxiliary capacitor line Csn.

Pixels are arranged in a matrix manner all over the display region R1 of the TFT substrate 11. Each of the pixels has a circuit configuration as shown in FIG. 5. For example, three pixels, which are arranged to be consecutively adjacent to each other, can be respectively assigned to R (Red) display, G (Green) display, and B (Blue) display for full color display.

Note that, according to Embodiment 2, the light sensor circuits are provided for the respective pixels. Embodiment 2 is, however, not limited to such. Alternatively, light sensor circuits can be provided for respective pixels that display a specific color (e.g., blue). Alternatively, 1 (one) light sensor circuit can be provided for a predetermined number of pixels. The number of the light sensor circuits can be determined in view of a resolution required in light detection.

Note that, in Embodiment 2, the source line Sm, an AMP power supply bus line Vsm described above, and a light sensor output bus line Vom described above are provided separately. Embodiment 2 is, however, not limited to such. For the purpose of improving an aperture ratio in each pixel, the source line Sm and the AMP power supply bus line Vsm can be formed by a common line according to need, while the source line Sm+1 adjacent to the source line Sm and the light sensor output bus line Vom+1 can be formed by a common line.

As shown in FIG. 4, in a peripheral region of the display region R1 of the TFT substrate 11, there are provided a display scan signal line drive circuit 12, a display video signal line drive circuit 13, a sensor scan signal line drive circuit 14, a sensor reading circuit 15, a sensed image processing section 16, and a power supply circuit 17.

Note that at least some of the circuit elements, in each of the above drive circuits that are provided in the peripheral region of the TFT substrate 11, can be monolithically formed at the same time as formation of each element provided in the display region R1.

In Embodiment 2, (i) the display scan signal line drive circuit 12, the display video signal line drive circuit 13, the sensor scan signal line drive circuit 14 and the sensor reading circuit 15 are monolithically formed at the same time as formation of each element provided in the display region R1 and (ii) the sensed image processing section 16 and the power supply circuit 17 are externally mounted on the TFT substrate 11. Embodiment 2 is, however, not limited to such.

Note that the phrase "monolithically formed" means that circuit elements are formed directly on the insulating substrate 2 by at least one of a physical process and a chemical process, but does not include a semiconductor circuit being mounted, as a module, onto a glass substrate. Note also that, though not shown in the drawings, in a case where a liquid crystal display device including a TFT substrate 11 is a VA (Vertical Alignment) mode liquid crystal display device, a common electrode and R (Red), G (Green) and B (Blue) color filters are provided on a counter substrate. Since Embodiment 2 is not limited to a specific liquid crystal mode, Embodiment 2 is also applicable to a TN (Twisted Nematic) mode. Embodiment 2 is further applicable to an IPS (In-Plane Switching) that is also called a lateral electric field application method. In this IPS mode, the common electrode is provided on the TFT substrate 11.

The display scan signal line drive circuit 12 generates a scanning signal for selectively scanning a line of pixels arranged in a matrix manner in the display region R1 and carries out the scanning by using the gate line Gn. The display video signal line drive circuit 13 supplies a video signal to pixels by using the source line Sm.

The sensor scan signal line drive circuit 14 selects 1 (one) line of light sensor circuits at a time and drives the 1 (one) line of the light sensor circuits. Each of the light sensor circuits includes a corresponding oxide TFT element 3, a corresponding a-Si TFT element 5, and a corresponding capacitor element 7 which are provided in a corresponding one of the plurality of pixels that are arranged in a matrix manner in the display region R1. The sensor reading circuit 15 supplies the power supply voltage VDD of a constant electric potential to a light sensor circuit, by using the AMP power supply bus line Vsm, and at the same time, reads out a light detection signal from the light sensor circuit by using the light sensor output bus line Vom.

The sensed image processing section 16 is configured by an LSI (Large Scale Integrated Circuit), a PC (Programmable Controller), and the like. The sensed image processing section 16 generates, from light detection signals outputted from the light sensor circuits, (i) an image obtained by scanning a document, (ii) information regarding, for example, a position of a finger or a pointing pen with respect to the display region R1 of the liquid crystal display device, and/or the like. The sensed image processing section 16 generates such a scanned image, such information, and/or the like, according to a stored image processing program.

Further, the power supply circuit 17 supplies, to each of the circuits 12 through 16, power supply voltage needed for operation of each of the circuits 12 through 16.

Note that the configuration of the liquid crystal display device is not limited to the configuration described above. Alternatively, another circuit, such as the display scan signal line drive circuit 12 or the display video signal line drive circuit 13, can have the function of the sensor scan signal line drive circuit 14 or the sensor reading circuit 15. Furthermore, the sensed image processing section 16 can have the function of the sensor reading circuit 15.

(Configuration of First TFT Element Serving as Switching Element Provided in Each of Pixels)

FIG. 6 is a cross sectional view illustrating a configuration of an oxide pixel TFT element 8 serving as a switching element provided in each pixel of the TFT substrate 11.

As illustrated in FIG. 6, an oxide pixel TFT element 8, serving as a switching element provided in each pixel of the TFT substrate 11 is formed in a top gate type configuration. According to the oxide pixel TFT element 8, a gate electrode 8g formed above the oxide semiconductor layer 8h via a first gate insulating layer 4 is provided above a source and drain electrode layer 8s/8d that is electrically connected to the oxide semiconductor layer 8h.

The oxide semiconductor layer 8h provided in the oxide pixel TFT element 8 is formed by the same layer as an oxide semiconductor layer 3h that is provided in the oxide TFT element 3 described above. The gate electrode 8g is formed by the same layer as the gate electrode 3g. The source and drain electrode layer 8s/8d is formed by the same layer as the source and drain electrode layer 3s/3d.

In addition, an auxiliary capacitor 18 is formed so as to be electrically connected to a drain electrode 8d of the oxide pixel TFT element 8.

The auxiliary capacitor 18 is formed by an auxiliary capacitor electrode 18a, a second gate insulating layer 6, and an auxiliary capacitor counter electrode 18b. The auxiliary capacitor electrode 18a is formed by the same layer as the gate electrodes 5g and 8g. The auxiliary capacitor counter electrode 18b is formed so that auxiliary capacitor counter electrode 18b and the auxiliary capacitor electrode 18a overlap each other when viewed from above. Note that the auxiliary capacitor counter electrode 18b is formed by the same layer as the source and drain electrode layer 5s/5d. Note also that the auxiliary capacitor counter electrode 18b is electrically connected to the drain electrode 8d of the oxide pixel TFT element 8 via a contact hole that is formed through the first gate insulating layer 4 and the second gate insulating layer 6.

A passivation film 20 is formed on the auxiliary capacitor counter electrode 18b. A pixel electrode 21 is formed on the passivation film 20. The pixel electrode 21 and the auxiliary capacitor counter electrode 18b are electrically connected to each other via a contact hole formed in the passivation film 20.

Note that, in Embodiment 2, the auxiliary capacitor counter electrode 18b of the auxiliary capacitor 18 is formed by the same layer as the source and drain electrode layer 5s/5d. Embodiment 2 is, however, not limited to such. Alternatively, the auxiliary capacitor counter electrode 18b of the auxiliary capacitor 18 can be formed by the same layer as the source and drain electrode layer 8s/8d. In this case, the first gate insulating layer 4 is provided between the auxiliary capacitor electrode 18a and the auxiliary capacitor counter electrode 18b. This causes the auxiliary capacitor 18 to be formed. In addition, the auxiliary capacitor counter electrode 18b of the auxiliary capacitor 18 can be formed by the same layer as the pixel electrode 21.

With the configuration, in each of the plurality of pixels, the oxide pixel TFT element 8 is formed which employs, as a channel layer, the oxide semiconductor layer 8h. The oxide semiconductor layer 8h can have a relatively high mobility without increasing a size of the channel layer.

It is thus possible to form an oxide pixel TFT element 8 in each of the plurality of pixels while reducing a size of the oxide pixel TFT element 8. This makes it possible to provide a TFT substrate 11 that has a high aperture ratio. The aperture ratio indicates a ratio of a region through which light can pass in each of the plurality of pixels.

Furthermore, with the configuration, the light sensor circuit includes the oxide TFT element 3 that includes the oxide semiconductor layer 3h serving as a channel layer. The oxide semiconductor layer 3h can have a relatively high mobility without increasing a size of the channel layer. This causes a reduction in area occupied by a light sensor circuit in each pixel that includes a light sensor element. As a result, it becomes possible to provide a TFT substrate 11 whose aperture ratio is high.

For example, in a case where a liquid crystal display device including a backlight is prepared by using such a TFT substrate 11 whose aperture ratio is high, it is possible to achieve a lower power consumption because a light amount of the backlight can be reduced.

By using such a TFT substrate 11, it becomes possible to provide a liquid crystal display device that has a light sensor function. That is, it becomes possible to provide a liquid crystal display device that doubles as a touch panel (area sensor).

Each pixel of the TFT substrate 11 includes an auxiliary capacitor 18 for holding, for a frame period, a voltage that is applied to each pixel without voltage attenuation. This auxiliary capacitor 18 is formed in the same production process as the oxide TFT element 3, the a-Si TFT element 5, the capacitor element 7 and the oxide pixel TFT element 8.

It is therefore possible to prepare a TFT substrate 11 including the auxiliary capacitor 18 without any additional production process for incorporating the auxiliary capacitor 18 into the TFT substrate 11.

Further, preferably, TFT elements are monolithically formed by the oxide TFT elements 3 and 8, in each of the display scan signal line drive circuit 12, the display video signal line drive circuit 13, the sensor scan signal line drive circuit 14 and the sensor reading circuit 15 that are provided in the peripheral region of the display region R1 of the substrate 11. The TFT elements are formed at the same time as formation of each element provided in the display region R1. Each of the oxide TFT elements 3 and 8 here includes, as a channel layer, the oxide semiconductor layer 3h/8h that can have a relatively high mobility without increasing a size of the channel layer.

With the configuration, it becomes possible to reduce a formation area where each of the circuits 12 through 15 are formed in the peripheral region of the display region R1 of the TFT substrate 11. This makes it possible to provide a TFT substrate 11 whose frame region is reduced.

(Method of Producing TFT Substrate)

Figure 7:
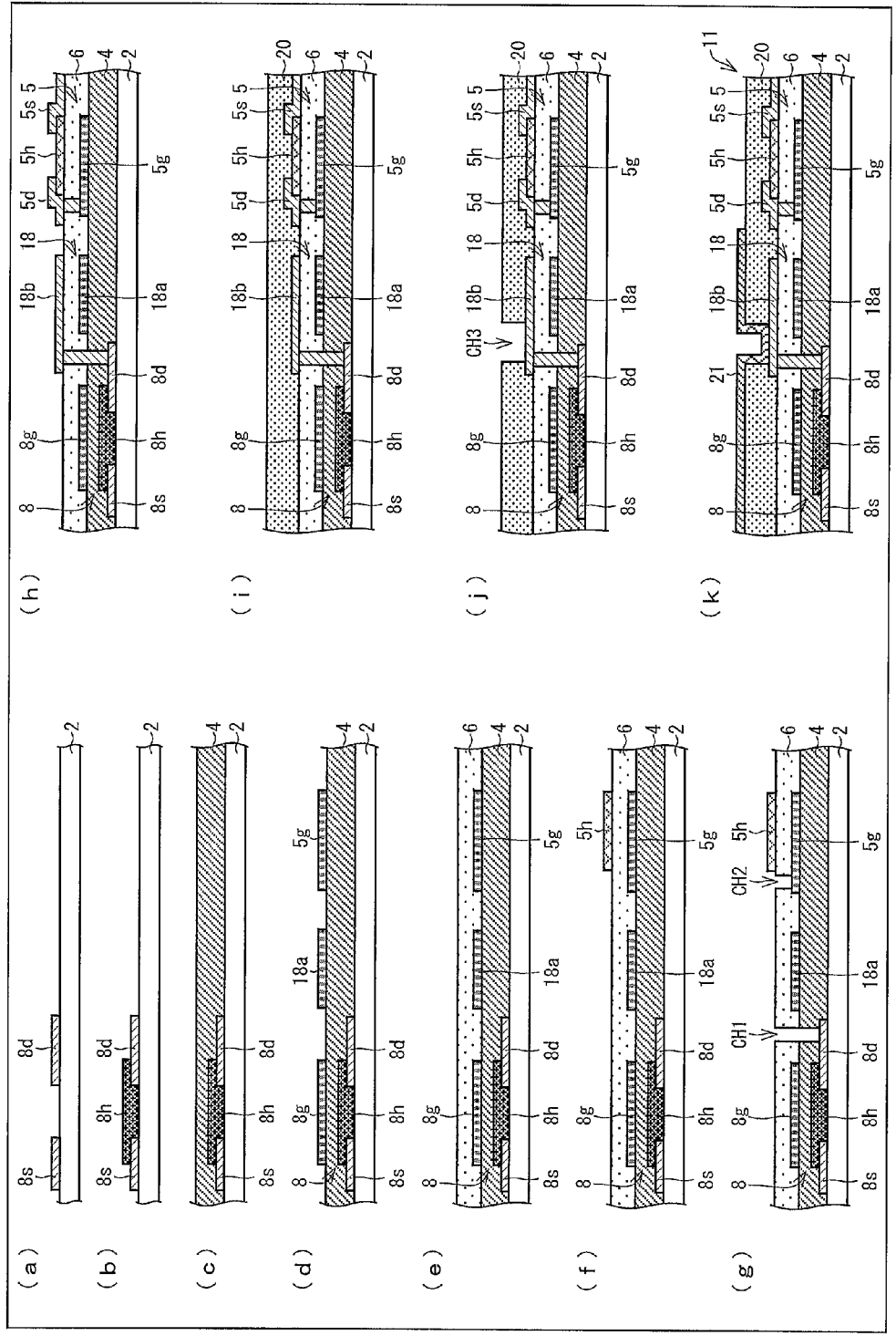
FIG. 7 is a process chart schematically illustrating the steps of producing a TFT substrate of the present invention, in the order of the steps.

The following description will discuss a method of producing a TFT substrate 11 with reference to FIG. 7, by focusing on key points for simplification.

FIG. 7 is a process chart schematically illustrating the steps of producing a TFT substrate 11 of the present invention, in the order of the steps.

Note that FIG. 7 omits to illustrate (i) an oxide TFT element 3 that is formed at the same time in the same production process by using the same material as an oxide pixel TFT element 8 and (ii) a capacitor element 7 that is formed at the same time in the same production process by using the same material as an auxiliary capacitor 18.

As illustrated in (a) of FIG. 7, after a source and drain electrode layer 8s/8d is formed on an insulating substrate 2, a source and drain electrode layer 8s/8d is patterned so as to have a predetermined shape. A source electrode 8s and a drain electrode 8d of the oxide pixel TFT element 8 are thus formed (step A).

As illustrated in (b) of FIG. 7, an oxide semiconductor layer 8h, that will become a channel layer of the oxide pixel TFT element 8, is deposited over an entire surface, and is then patterned so as to have a predetermined shape. The oxide semiconductor layer 8h is thus formed (step B). Note that the oxide semiconductor layer 8h is electrically connected to the source electrode 8s and the drain electrode 8d.

Subsequently, a first gate insulating layer 4 is deposited over an entire surface (step C) (see (c) of FIG. 7). The first gate insulating layer 4 can be made from a material such as $SiO_2$ or $SiN_x$. Note, however, that a material from which the first gate insulating layer 4 is made is not limited to such. Furthermore, the first gate insulating layer 4 can be subjected to, for example, a planarization process such as CMP (Chemical Mechanical Polishing) according to need.

Then, as illustrated in (d) of FIG. 7, predetermined patterns of (i) a gate electrode 8g of the oxide pixel TFT element 8, (ii) an auxiliary capacitor electrode 18a of the auxiliary capacitor 18, and (iii) a gate electrode 5g of an a-Si TFT element 5, are formed by using a single conductive layer (step D).

Next, as illustrated in (e) of FIG. 7, a second gate insulating layer 6 is deposited over an entire surface (step E). The second gate insulating layer 4 can be made from a material such as $SiO_2$ or $SiN_x$. Note, however, that a material from which the second gate insulating layer 4 is made is not limited to such. Furthermore, the second gate insulating layer 6 can be subjected to, for example, a planarization process such as CMP (Chemical Mechanical Polishing) according to need.

Then, as illustrated in (f) of FIG. 7, an amorphous silicon layer is (i) deposited over an entire surface, (ii) hydrotreated so as to become a hydrogenated amorphous silicon layer 5h. Subsequently, a predetermined patterning of the hydrogenated amorphous silicon layer 5h is formed so that the hydrogenated amorphous silicon layer 5h and the gate electrode 5g overlap each other when viewed from above (step F).

Then, as illustrated in (g) of FIG. 7, the first gate insulating layer 4 and the second gate insulating layer 6 are etched (step G) so as to have contact holes CH1 and CH2.

Next, as illustrated in (h) of FIG. 7, a source and drain electrode layer 5s/5d is formed and then patterned to have a predetermined shape. This causes formations of (a) the source electrode 5s and the drain electrode 5d of the a-Si TFT element 5 and (b) the auxiliary capacitor counter electrode 18b of the auxiliary capacitor 18 (step H). Note that the source electrode 5s and the drain electrode 5d of the a-Si TFT element 5 are formed so as to be electrically connected to the hydrogenated amorphous silicon layer 5h.

Note, in the step H, that (i) the auxiliary capacitor counter electrode 18b is electrically connected to the drain electrode 8d of the oxide pixel TFT element 8 via the contact hole CH1 and (ii) the drain electrode 5d of the a-Si TFT element 5 is electrically connected to the gate electrode 5g of the a-Si TFT element 5 via the contact hole CH2.

Next, as illustrated in (i) of FIG. 7, a passivation film 20 is deposited over an entire surface (step I). The passivation film 20 can be made from an inorganic film such as $SiO_2$ or $SiN_x$. Alternatively, a photosensitive organic insulating film, that can be subjected to patterning and whose main component is an acrylic resin, can be employed as the passivation film 20. Alternatively, an organic/inorganic hybrid film or the like can be employed as the passivation film 20. Note, however, that the passivation film 20 is not limited to the above described ones. Note that, in Embodiment 2, an inorganic film is employed as the passivation film 20.

Subsequently, as illustrated in (j) of FIG. 7, the passivation film 20 is etched (step J) so as to have a contact hole CH3. Note that in a case where a photosensitive organic insulating film is employed as the passivation film 20, patterning by exposure to light and development is possible. It is therefore possible to omit the step J of forming the contact hole CH3.

At the end, as illustrated in (k) of FIG. 7, a pixel electrode layer is formed, and is then patterned so as to have a predetermined shape. This causes a pixel electrode 21 to be formed (step K). Note that the pixel electrode 21 is electrically connected, via the contact hole CH3, to the auxiliary capacitor counter electrode 18b that is further electrically connected to the drain electrode 8d of the oxide pixel TFT element 8. The pixel electrode 21 can be made from ITO, IZO, or the like in a case of a transmissive liquid crystal display device. In a case of a transflective or reflective liquid crystal display device, the pixel electrode 21 can be made from Al or the like.

According to the method of producing a TFT substrate 11, an oxide semiconductor layer 3h/8h never comes in contact with the hydrogenated amorphous silicon layer 5h.

In other words, the first gate insulating layer 4, the second gate insulating layer 6 and a gate electrode layer 3g/8g are present between the hydrogenated amorphous silicon layer 5h and the oxide semiconductor layer 3h/8h, all the time that includes during the production process. Accordingly, hydrogen in the hydrogenated amorphous silicon layer 5h can be prevented from adversely affecting the oxide semiconductor layer 3h/8h.

With the above production method, it is therefore possible to prevent a deterioration in element characteristics of the oxide TFT element 3 and the oxide pixel TFT element 8 which include the oxide semiconductor layer 3h/8h serving as a channel layer.

Embodiment 3

Figure 9:
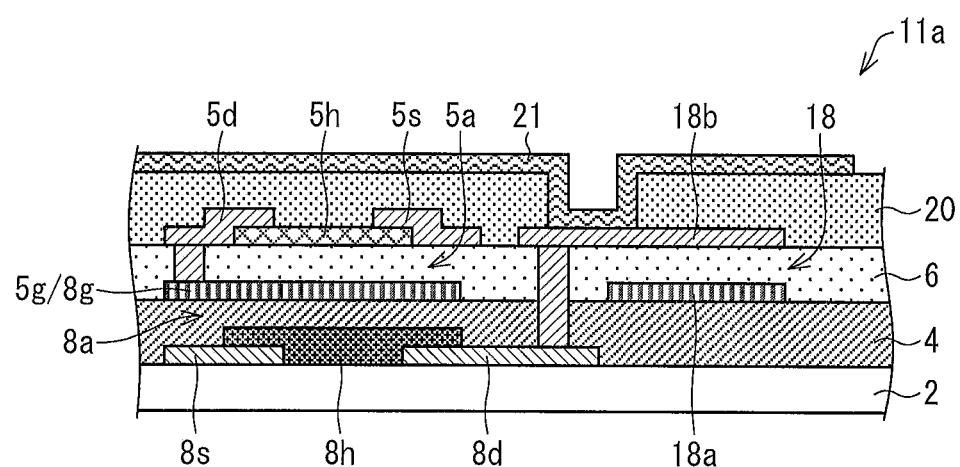
FIG. 9 is a cross sectional view illustrating a configuration of a second TFT element serving as a light sensor element, a first TFT element serving as a switching element and an auxiliary capacitor which are provided in each pixel of the TFT substrate of another embodiment of the present invention.
Figure 10:
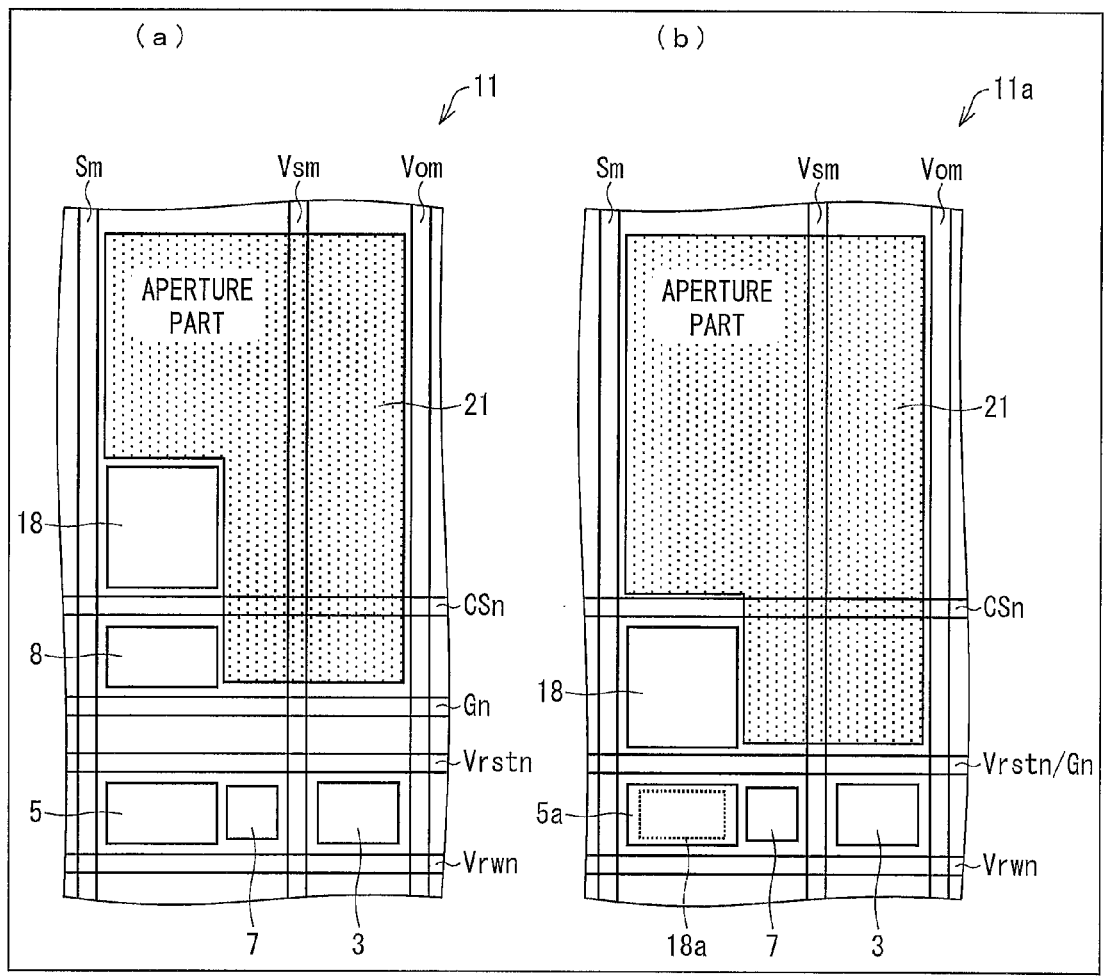
FIG. 10 is a plan view of an aperture part of each of a TFT substrate of Embodiment 2 and a TFT substrate of Embodiment 3.

The following description will discuss Embodiment 3 of the present invention, with reference to FIGS. 8 through 10. Embodiment 3 is different from Embodiment 2 in that (i) an a-Si TFT element 5a and an oxide pixel TFT element 8a have a common gate electrode and (ii) (a) the oxide semiconductor layer 8h and a source and drain electrode layer 8s/8d and (b) the hydrogenated amorphous silicon layer 5h and a source and drain electrode layer 5s/5d, are formed so as to at least partially overlap each other when viewed from above. The a-Si TFT element 5a employs, as a channel layer, a hydrogenated amorphous silicon layer 5h and serves as a light sensor element. Meanwhile, the oxide pixel TFT element 8a employs, in each pixel, an oxide semiconductor layer 8h serving as a channel layer. The oxide pixel TFT element 8a has a function of a switching element. The oxide semiconductor layer 8h and the source and drain electrode layer 8s/8d are provided in the oxide pixel TFT element 8a that is electrically connected to the pixel electrode 21. Meanwhile, the hydrogenated amorphous silicon layer 5h and the source and drain electrode layer 5s/5d are provided in the a-Si TFT element 5a that constitutes a light sensor circuit. Other configurations of Embodiment 3 are the same as those described in Embodiment 2. For convenience, members having the same functions as the members shown in drawings of Embodiment 2 are given identical reference signs and their descriptions are omitted.

FIG. 8 is a circuit diagram showing a circuit configuration of 1 (one) pixel of a TFT substrate in accordance with Embodiment 3.

As shown in FIG. 8, according to Embodiment 3, a timing of driving an oxide pixel TFT element 8a, serving as a switching element, that is provided in each pixel is caused to be coincide with a timing of driving an a-Si TFT element 5a serving as a light sensor element. As a result, a single common line can double as (i) a gate line Gn to which a signal for driving the oxide pixel TFT element 8a is supplied and (ii) a photodiode-resetting line Vrstn via which a signal for driving the a-Si TFT element 5a is supplied.

In other words, according to the circuit configuration of Embodiment 3, a timing at which a reset signal RST becomes a high level is set so as to coincide with a timing at which a scanning signal becomes a high level. The reset signal RST is supplied from a sensor scan signal line drive circuit 14 via the photodiode-resetting line Vrstn. The scanning signal is supplied from the display scan signal line drive circuit 12 via the gate line Gn.

With the configuration, the oxide pixel TFT element 8a and the a-Si TFT element 5a can be concurrently driven by a single common signal supplied via a single common line Vrstn/Gn.

FIG. 9 is a cross sectional view illustrating a configuration of the a-Si TFT element 5a serving as a light sensor element, the oxide pixel TFT element 8a serving as a switching element, and the auxiliary capacitor 18 which are provided in each pixel of the TFT substrate of Embodiment 3.

As illustrated in FIG. 9, in the TFT substrate of Embodiment 3, the a-Si TFT element 5a is formed in a bottom gate type configuration. This a-Si TFT element 5a includes, as a channel layer, the hydrogenated amorphous silicon layer 5h and serves as a light sensor element. Meanwhile, the oxide pixel TFT element 8a is formed in a top gate type configuration and provided in each pixel. This oxide pixel TFT element 8a employs, as a channel layer, the oxide semiconductor layer 8h, and serves as a switching element. The gate electrode 5g of the a-Si TFT element 5a and the gate electrode 8g of the oxide pixel TFT element 8a are formed as a single common gate electrode 5g/8g. This gate electrode 5g/8g is formed by the same layer as the one common line Vrstn/Gn as described above, and is electrically connected to the line Vrstn/Gn.

Further, the oxide semiconductor layer 8h and the source and drain electrode layer 8s/8d are formed so as to overlap with the hydrogenated amorphous silicon layer 5h and the source and drain electrode layer 5s/5d, when viewed from above. The oxide semiconductor layer 8h and the source and drain electrode layer 8s/8d here are provided in the oxide pixel TFT element 8a that is electrically connected to the pixel electrode 21. Meanwhile, the hydrogenated amorphous silicon layer 5h and the source and drain electrode layer 5s/5d here are provided in the a-Si TFT element 5a that constitutes the light sensor circuit.

(a) of FIG. 10 is a plane view of an aperture part of the TFT substrate 11 of Embodiment 2; and (b) of FIG. 10 shows a plan view of an aperture part of TFT substrate 11a of Embodiment 3.

According to the TFT substrate 11 of Embodiment 2, the oxide pixel TFT element 8 and the a-Si TFT element 5 are formed so as not to overlap each other when viewed from above (see (a) of FIG. 10). It follows that an oxide pixel TFT element 8 and an a-Si TFT element 5 occupy respective different areas in each pixel.

On the other hand, according to the TFT substrate 11a of Embodiment 3, an oxide pixel TFT element 8a and an a-Si TFT element 5a are formed so as to overlap each other when viewed from above (see (b) of FIG. 10). It is therefore possible to increase, in each pixel, an area for forming a pixel electrode 21 by an area corresponding to an area for forming an oxide pixel TFT element 8a that is formed below a corresponding a-Si TFT element 5a. Further, with the above configuration, the gate line Gn and the photodiode-resetting line Vrstn are arranged to be a single common line.

Accordingly, as compared to the configuration as shown in (a) of FIG. 10 where the above lines are separately provided, an area for forming lines within a pixel can be reduced.

According to Embodiment 3, an area for forming such lines and elements are reduced. It is therefore possible to provide a TFT substrate 11a that has a high aperture ratio.

Embodiment 3 discusses above, as an example, a configuration where: (i) the a-Si TFT element 5a that constitutes the light sensor circuit is formed so as to overlap with the oxide pixel TFT element 8a when viewed from above, the oxide pixel TFT element 8a being provided as a switching element for controlling each of the above pixels to be turned on/off; and (ii) the a-Si TFT element 5a is formed so as not to overlap with an oxide TFT element when viewed from above, the oxide TFT element constituting the light sensor circuit. However, note that Embodiment 3 is not limited to such. Alternatively, it is also possible to configure the present invention, for example, in a manner such that: (i) the a-Si TFT element 5a and oxide TFT element that constitute the light sensor circuit is formed so as to overlap each other when viewed from above; and (ii) the a-Si TFT element 5a that constitutes the light sensor circuit is formed so as not to overlap with the oxide pixel TFT element 8a when viewed from above, the oxide pixel TFT element 8a being provided as a switching element for controlling each of the pixels to be turned on/off.

Embodiment 4

The following description will discuss Embodiment 4 of the present invention, with reference to FIGS. 11 through 16. Embodiment 4 is different from Embodiments 1 through 3 in that Embodiment 4 describes a liquid crystal display device that includes a protective circuit. The protective circuit includes an a-Si TFT element 5 that employs, as a channel layer, a hydrogenated amorphous silicon layer 5h. Other configurations of Embodiment 4 are as described in Embodiments 1 through 3. For convenience, members having the same functions as the members shown in drawings of Embodiment 2 are given identical reference signs and their descriptions are omitted.

(Configuration of Display Device)

Figure 11:
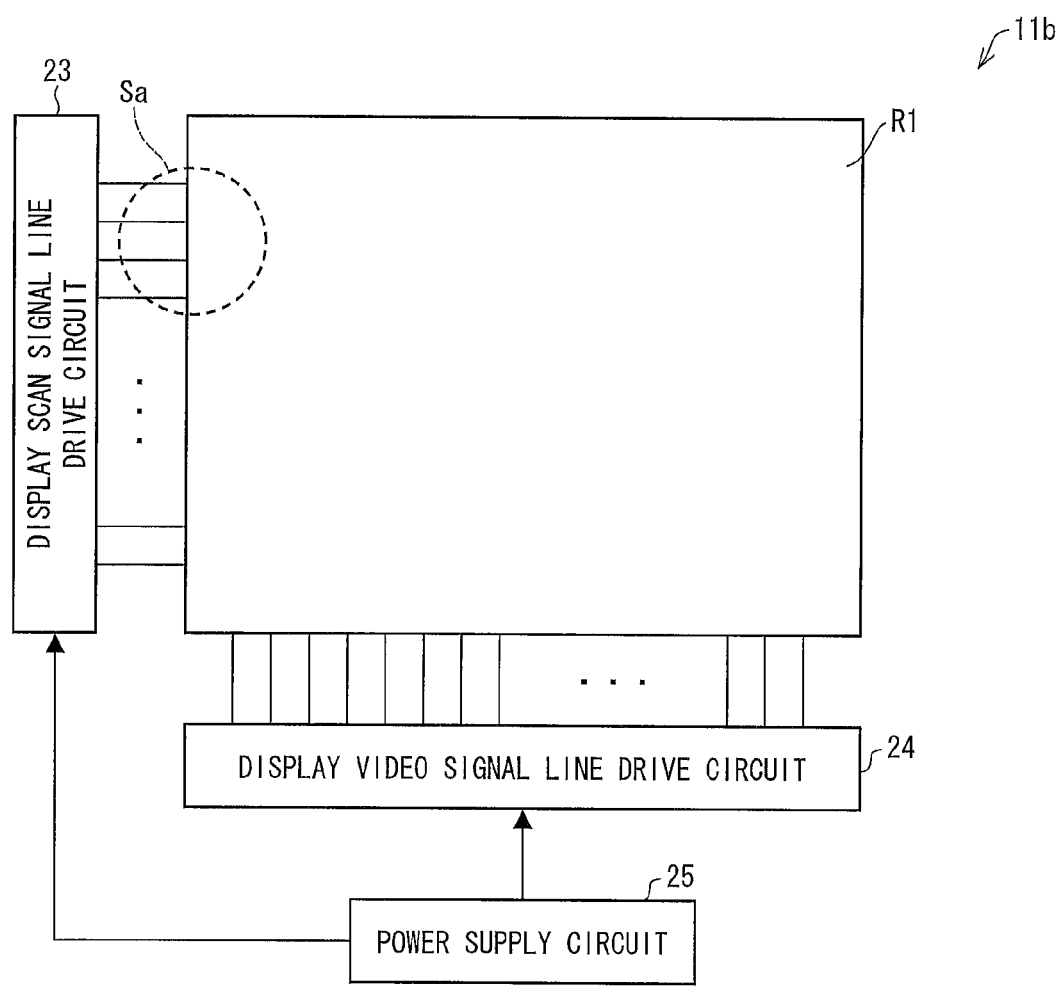
FIG. 11 is a block diagram schematically showing a TFT substrate of still another embodiment of the present invention including a protective circuit.

FIG. 11 is a block diagram schematically showing a TFT substrate 11b of Embodiment 4 including a protective circuit. The TFT substrate 11b includes a display region R1 (it is assumed that no light sensor circuit is formed in the display region R1), a display scan signal line drive circuit 23, a display video signal line drive circuit 24, a power supply circuit 25 which supplies a power supply voltage needed for operation of each of drive circuits 23 and 24. Note that a configuration of the TFT substrate 11b is not limited to an example configuration of the TFT substrate 11b as shown in FIG. 11.

In a peripheral region of the display region R1 in the TFT element 11b, a protective circuit is provided for protecting an oxide pixel TFT element (not shown) from external noise or the like. Note that the oxide pixel TFT element is electrically connected to a pixel electrode (not shown) that is formed in the display region R1. The protective circuit includes an a-Si TFT element (not shown) that employs, as a channel layer, a hydrogenated amorphous silicon layer.

Figure 12:
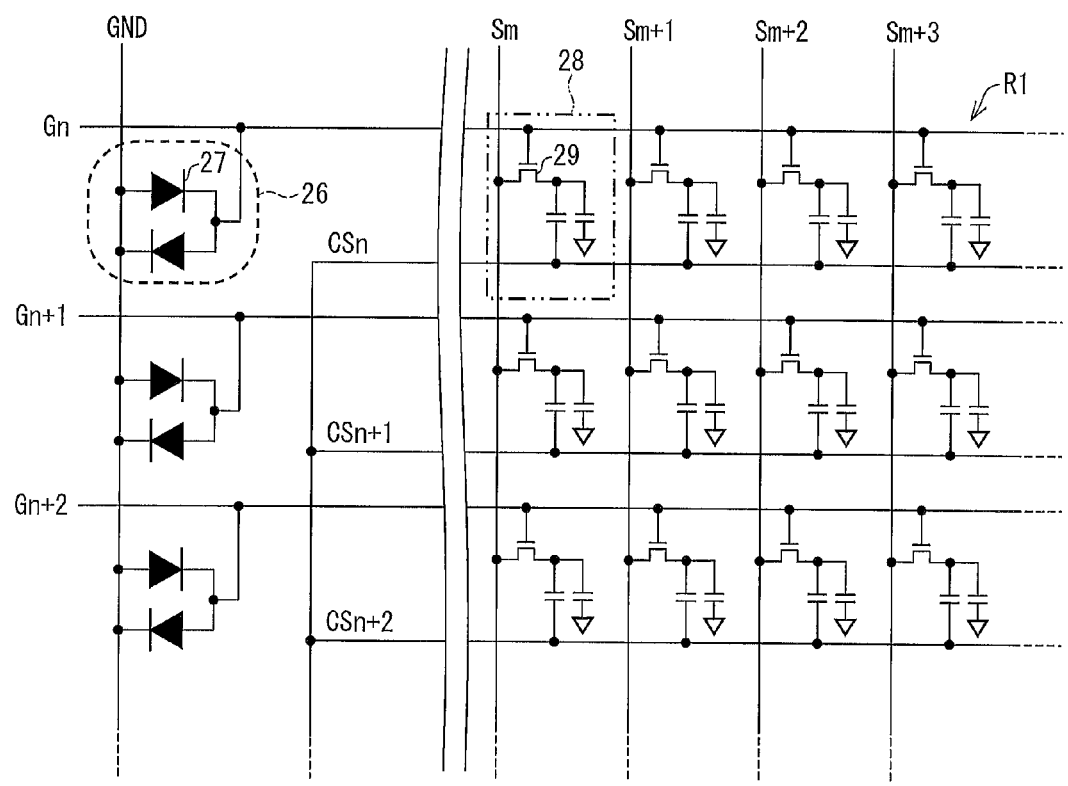
FIG. 12 is a circuit diagram showing a circuit configuration of a protective circuit formed in a region Sa shown in FIG. 11 and a pixel circuit formed in a display region R1.

FIG. 12 is a circuit diagram showing a circuit configuration of a protective circuit 26 formed in a region Sa shown in FIG. 11 and a pixel circuit 28 formed in the display region R1.

The TFT substrate 11b of Embodiment 4 includes, for example, the protective circuit 26 for circuit protection of a pixel driving TFT element 29 (oxide pixel TFT element) of the pixel circuit 28. The protective circuit 26 is configured to include, for example, TFT elements (a-Si TFT element) each of which functions as a diode 27. The pixel driving TFT 29 (oxide pixel TFT element) is an oxide TFT, while the TFT element (a-Si TFT element) is an a-Si TFT.

That is, an a-Si TFT is employed in a case of an element (e.g. protective element) that is required to have a high resistance. Meanwhile, an oxide semiconductor is employed in a case of an element (e.g. pixel driving TFT element) that preferably has a low resistance (high mobility).

Specifically, as shown in FIG. 12, the protective circuit 26 is a bidirectional diode including first and second diodes 27 in which (i) a cathode of the first diode 27 is connected with an anode of the second diode 27 and (ii) a cathode of the second diode 27 is connected with an anode of the first diode 27. Such a protective circuit 26 is provided for a corresponding gate line Gn. The protective circuit 26 is also called a diode short ring. One end of the protective circuit 26 is connected to a gate line Gn, while the other end of the protective circuit 26 is connected to, for example, a grounded line GND.

With this configuration, it is possible to quickly form an electric discharge path between the gate line Gn and the grounded line GND, even in a case where an excessive voltage, that is caused by static electricity or the like, is applied to the gate line Gn. Accordingly, the pixel driving TFT element 29 or the like that constitutes the pixel circuit 28 can be protected from such an excessive high voltage. Furthermore, the bidirectional diode can address both positive or negative excessive voltages.

Figure 13:
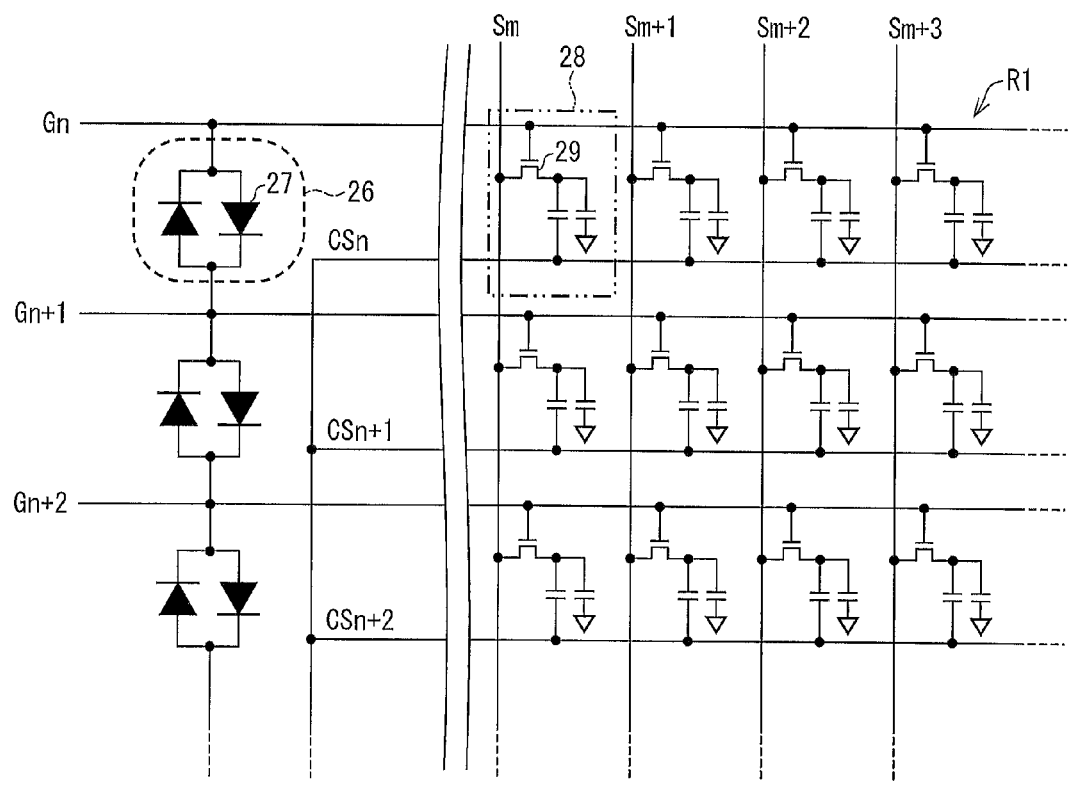
FIG. 13 is a circuit diagram showing another example of the protective circuit provided on the TFT substrate of the still another embodiment of the present invention.

Alternatively, as shown in FIG. 13, a protective circuit 26 can be provided between gate lines Gn and Gn+1 that are adjacent to each other are connected to each other. With the configuration, an excessively high voltage, that is applied to one gate line Gn, can be shared by gate lines. Accordingly, the pixel circuit 28 can be similarly protected.

(Significance of Arranging TFTs of Protective Circuit by a-Si TFTs)

As described above, an a-Si TFT is employed as a TFT that functions as the diode 27 of the protective circuit 26. This is effective for reducing (i) an area that is occupied by the protective circuit 26 and (ii) a frame size of the TFT substrate 11b.

An oxide TFT has a characteristic that an ON resistance is one order of magnitude smaller than that of the a-Si TFT. Accordingly, in a case where oxide TFTs are employed in the protective circuit 26 of FIG. 12, there is a possibility that a current leakage will be caused between the gate line Gn and the grounded line GND. Similarly, in a case where oxide TFTs are employed in the protective circuit 26 of FIG. 13, a current leakage will be caused between adjacent gate lines.

Figure 15:
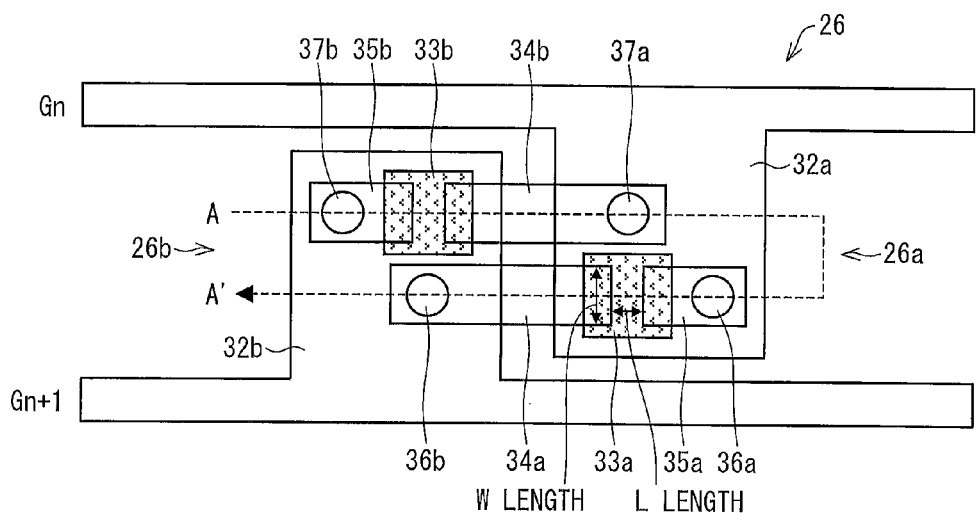
FIG. 15 is a plane view schematically illustrating a protective circuit and TFTs provided on the TFT substrate of the still another embodiment of the present invention.

Accordingly, in a case where oxide TFTs are to be employed as the diodes 27 of the protective circuit 26, it becomes necessary to lengthen a channel length (L length) of each of the oxide TFTs as illustrated in FIG. 15 so that each of the oxide TFTs can secure a higher ON resistance. This necessitates an increase in size of each of the oxide TFTs, which will, however, discourage a reduction in area of a frame of the TFT substrate 11b.

Note that, in a case where no protection circuit 26 is provided and a priority is given on a reduction in area of the frame of the TFT substrate 11b, a problem such as a dielectric breakdown will occur in the pixel circuit 28 and a yield will be decreased in production of the TFT substrate 11b.

According to Embodiment 4, oxide TFTs are employed as transistor elements that perform respective principal operations. That is, the oxide TFTs are employed as the transistor elements such as (i) switching elements for respective pixels of the TFT substrate 11b and (ii) transistor elements each of which is included in the display scan signal line drive circuit 23 or the display video signal line drive circuit 24. The display scan signal line drive circuit 23 and the display video signal line drive circuit 24 are monolithically formed on the single insulating substrate where the switching elements are formed. This allows an improvement in responsiveness or drive performance.

Furthermore, because each of the transistor elements constituting the protective circuit 26 is an a-Si TFT, it is possible to reduce an area of a frame of the TFT substrate 11b. This ultimately contributes to a reduction in size of the display device.

Note that the protective circuit 26 can also be provided for a source line Sm as disclosed in the foregoing Patent Literature 3. The protective circuit 26 is not limited to the configurations shown in FIGS. 12 and 13.

(Plane Structure of Bidirectional Diode)

Figure 14:
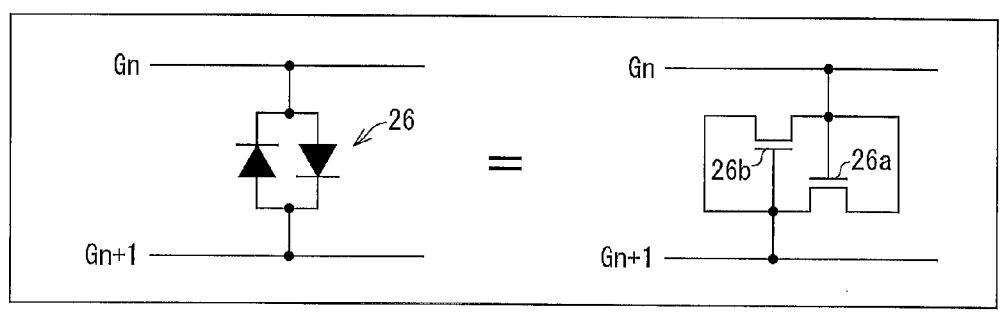
FIG. 14 is an equivalent circuit diagram showing a bidirectional diode constituting the protective circuit provided on the TFT substrate of still another embodiment of the present invention, by using an electric circuit symbol of TFTs.

FIG. 14 is an equivalent circuit diagram showing a bidirectional diode that constitutes the protective circuit 26, by using an electric circuit symbol of TFTs. As shown in FIG. 14, the protective circuit 26 includes two TFTs 26a and 26b in each of which a drain and a gate are short-circuited. A gate of the TFT 26a is connected to a gate line Gn while a gate of the TFT 26b is connected to an adjacent gate line Gn+1. Further, a source of the TFT 26a is connected to the gate of the TFT 26b while a source of the TFT 26b is connected to the gate of the TFT 26a.

FIG. 15 is a plane view schematically illustrating the protective circuit 26 and the TFTs. As illustrated in FIG. 15, the TFT 26a has a gate electrode 32a thrown out from the gate line Gn toward the gate line Gn+1. On a channel layer 33a made from an a-Si semiconductor that is provided above the gate electrode 32a, a source electrode 34a and a drain electrode 35a face each other via a gap.

The drain electrode 35a is connected to the gate electrode 32a via a contact hole 36a. The source electrode 34a is connected to a gate electrode 32b of the TFT 26b via the contact hole 36b.

Similarly, the TFT 26b has a gate electrode 32b thrown out from the gate line Gn+1 towards the gate line Gn. On a channel layer 33b made from an a-Si semiconductor that is provided above the gate electrode 32b, a source electrode 34b and a drain electrode 35b face each other via a gap.

The drain electrode 35b is connected to the gate electrode 32b via a contact hole 37b. The source electrode 34b is connected to the gate electrode 32a of the TFT 26a via the contact hole 37a.

Both of the channel layer 33a and the channel layer 33b are made of a-Si semiconductor. Accordingly, even in a case where (i) a channel width (W length) shown in FIG. 15 is arranged to be equal to that of the oxide TFT and (ii) a channel length (L length) is arranged to be shorter than that in the case of the oxide TFT, a necessary ON resistance can be obtained.

(Cross Sectional Structure of Bidirectional Diode)

Figure 16:
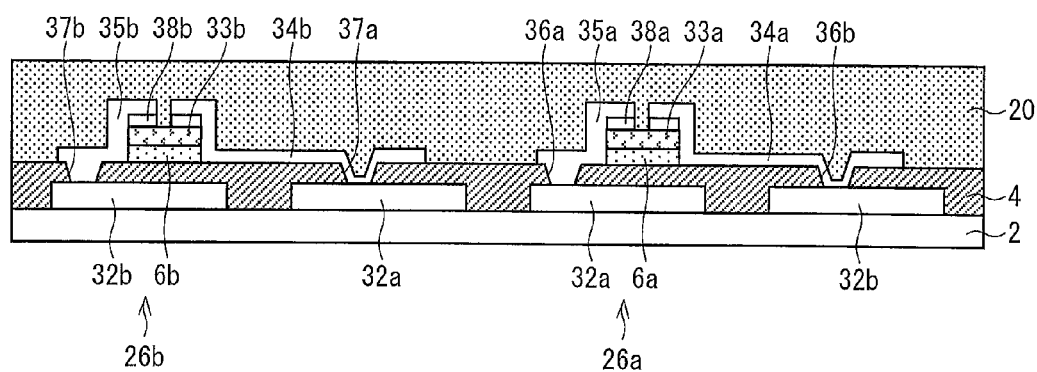
FIG. 16 is a cross sectional view that is taken along line A-A' shown in FIG. 15 and that schematically illustrates the protective circuit provided on the TFT substrate of the still another embodiment of the present invention.

FIG. 16 is a cross sectional view schematically illustrating the protective circuit 26, taken along line A-A' shown in FIG. 15. As illustrated in FIG. 16, the TFTs 26a and 26b are formed on a single insulating substrate 2, and covered and protected by a passivation film 20.

Each of the TFTs 26a and 26b has the gate electrodes 32a and 32b on the insulating substrate 2, and the gate electrodes 32a and 32b are covered by the first gate insulating layer 4. In respective positions above the gate electrodes 32a and 32b, second gate insulating layers 6a and 6b that correspond to a second gate insulating layer 6 is formed on the first gate insulating layer 4.

Further, on the second gate insulating layers 6a and 6b, channel layers 33a and 33b made of a-Si semiconductor are formed, respectively. On the channel layers 33a and 33b, conductive layers 38a and 38b are formed so that each of the conductive layers 38a and 38b have a gap. On the conductive layer 38a, the source electrode 34a and the drain electrode 35a are formed so as to face each other via a gap. On the conductive layer 38b, the source electrode 34b and the drain electrode 35b are formed so as to face each other via a gap.

The source electrode 34a extends onto the gate electrode 32b of the TFT 26b and connected to the gate electrode 32b via the contact hole 36b.

The drain electrode 35a is connected to the gate electrode 32a of the TFT 26a itself via the contact hole 36a.

Meanwhile, the source electrode 34b extends onto the gate electrode 32a of the TFT 26a and connected to the gate electrode 32a via the contact hole 37a.

The drain electrode 35b is connected to the gate electrode 32b of the TFT 26b itself via the contact hole 37b.

On the circuit board of the present invention, gate electrodes of the first transistor element and the second transistor element are preferably formed by the second conductive layer.

According to the above configuration, the gate electrodes of the first transistor element and the second transistor element can be a single common gate electrode. This makes it possible to reduce the number of lines necessary for driving the first transistor element and the second transistor element.

Further, the first transistor element and the second transistor element can be formed such that: a size of the first transistor element becomes equal to a size of the second transistor element; and the first transistor element and the second transistor element completely overlap each other when viewed from above.

This makes it possible to reduce a formation area where transistor elements and lines are formed on the insulating substrate. This consequently makes it possible to provide a circuit board that has a high degree of integration.

In the circuit board of the present invention, pairs of the source and drain electrodes of the first transistor element and the second transistor element are preferably formed by the second conductive layer.

According to the above configuration, the pairs of the source and drain electrodes of the first transistor element and the second transistor element can be a single common pair of source and drain electrodes. This makes it possible to reduce the number of lines necessary for driving the first transistor element and the second transistor element.

Further, by arranging the pairs of source and drain electrodes of the first transistor element and the second transistor element to be a single common pair of source and drain electrodes, the first transistor element and the second transistor element can be configured to partially overlap each other when viewed from above.

This makes it possible to reduce a formation area where transistor elements and lines are formed on the insulating substrate. This consequently makes it possible to provide a circuit board that has a high degree of integration.

Further, according to the above configuration, in one of a layer above the first semiconductor layer and a layer below the first semiconductor layer in the first transistor element, the gate electrode can be formed by the first conductive layer. Further, in the other one of the layer above the first semiconductor layer and the layer below the first semiconductor layer, a light shielding film can be formed by the third conductive layer.

Similarly, in one of a layer above the second semiconductor layer and a layer below the second semiconductor layer in the second transistor element, the gate electrode can be formed by the third conductive layer. Further, in the other one of the layer above the second semiconductor layer and the layer below the second semiconductor layer, a light shielding film can be formed by the first conductive layer.

In other words, the gate electrode and the light shielding layer of the first transistor element can be respectively provided above and below the first semiconductor layer, so as to cover two opposed surfaces of the first semiconductor layer. Further, the light shielding layer of the first transistor element can be formed by a formative layer by which the gate electrode of the second transistor element is formed. Meanwhile, the gate electrode and the light shielding layer of the second transistor element can be respectively provided above and below the second semiconductor layer, so as to cover two opposed surfaces of the second semiconductor layer. Further, the light shielding layer of the second transistor element can be formed by a formative layer by which the gate electrode of the first transistor element is formed.

Accordingly, according to the above configuration, light from both top and bottom directions of the circuit board can be shielded by using the gate electrode and the formative layer by which the gate electrode is formed, so that such light does not enter the semiconductor layer.

For example, in a case where the circuit board is employed as an active matrix substrate of a liquid crystal display device, light which enters the semiconductor layer has been conventionally shielded by using, in general, a black matrix. The black matrix is provided on a counter substrate that is provided so as to be opposed to the active matrix substrate. Accordingly, a large margin is required for compensating a displacement that may occur when combining the active matrix substrate and the counter substrate. For this margin, an aperture ratio of the liquid crystal display device has been conventionally decreased.

In contrast, according to the configuration where the light is shielded by using the gate electrodes and the formative layers by which the gate electrode is formed, alignment becomes possible at the same precision as that in a photo resist process. Accordingly, a large margin becomes unnecessary unlike a conventional configuration. Accordingly, an aperture ratio of a liquid crystal display device can be increased.

Furthermore, according to the above configuration, light can be shielded at a position that is closer to the semiconductor layer. Therefore, the above configuration is excellent in shielding oblique light.

In the circuit board of the present invention, preferably, (a) the gate electrode of one of the first transistor element and the second transistor element and (b) the pair of source and drain electrodes of the other one of the first transistor element and the second transistor element are formed by the second conductive layer.

With the above configuration, for example, in a circuit in which a gate electrode of one of the first transistor and the second transistor is electrically connected to the source and drain electrodes of the other one of the first transistor and the second transistor, the gate electrode and the source and drain electrodes are formed by the second conductive layer. Therefore, it is possible to electrically connect the gate electrode and the source and drain electrodes, without any contact hole, only by patterning the second conductive layer.

Further, with the above configuration, the gate electrode of one of the first transistor element and the second transistor element and the source electrode (or drain electrode) of the other one of the first transistor element and the second transistor element can be integrated. This makes it possible to arrange the first transistor element and the second transistor element to overlap each other when viewed from above.

This makes it possible to reduce a formation area where transistor elements and lines are formed on the insulating substrate. This consequently makes it possible to provide a circuit board that has a high degree of integration.

In the circuit board of the present invention, preferably, the first transistor element and the second transistor element are formed so as to at least partially overlap each other when viewed from above.

According to the above configuration, the first transistor element and the second transistor element can be arranged so as to at least partially overlap each other when viewed from above.

This makes it possible to reduce a formation area where transistor elements are formed on the insulating substrate. This consequently makes it possible to provide a circuit board that has a high degree of integration.

In the circuit board of the present invention, preferably, the first transistor element and the second transistor element are formed so as to partially overlap each other when viewed from above.

According to the above configuration, in a case where (a) the gate electrode of one of the first transistor element and the second transistor element and (b) the source and drain electrodes of the other one of the first transistor element and the second transistor element are formed by the second conductive layer, the first transistor element and the second transistor element are formed so as to partially overlap each other when viewed from above.

This makes it possible to reduce a formation area where transistor elements are formed on the insulating substrate. This consequently makes it possible to provide a circuit board that has a high degree of integration.

In the circuit board of the present invention, preferably, the first semiconductor layer and the second semiconductor layer are made of different materials, respectively.

According to the above configuration, for example, the one of the first transistor element and the second transistor element can be configured to include, as a channel layer, an oxide semiconductor layer that has a characteristic in which its sensitivity to light is low but that can have a relatively high mobility without increasing a size of the one of the first transistor element and the second transistor element. Meanwhile, the other one of the first transistor element and the second transistor element can be configured to include, as a channel layer, an amorphous silicon layer that has a low mobility but that can have a relatively high sensitivity to light.

Therefore, as described above, it is possible to form, on a single insulating substrate, the first transistor element and the second transistor element that have different functions, respectively. This makes it possible to reasonably fabricate, on a single insulating substrate, devices (circuits) respectively having different functions.

Further, as in the example case discussed above, the first semiconductor layer in the first transistor and the second semiconductor layer in the second transistor element are incompatible but formed so as to be adjacent to each other, the following problem may occur.

The following discusses an example case where the first semiconductor layer is made of an oxide semiconductor layer and the second semiconductor layer is made of an amorphous silicon layer.

In general, the amorphous silicon layer includes a large number of dangling bonds (nonbonding electrons). The amorphous silicon layer is obtained by hydrotreating such dangling bonds with the use of a large amount of hydrogen. Accordingly, in the amorphous silicon layer, a large amount of hydrogen remains. As a result, in a case where the oxide semiconductor layer is formed so as to be adjacent to the amorphous silicon layer, hydrogen in the amorphous silicon layer may adversely affect the oxide semiconductor layer. This will ultimately cause a deterioration in element characteristics of the transistor element that includes the oxide semiconductor layer.

According to the above configuration, between the first semiconductor layer and the second semiconductor layer, the second conductive layer is formed. Accordingly, the above adverse effect can be prevented by the second conductive layer in the above configuration. Therefore, regardless of compatibility of materials of the first semiconductor layer and the second semiconductor layer, the above configuration can generally be employed.

In the circuit board of the present invention, preferably, the second semiconductor layer is a semiconductor layer contains an amorphous silicon layer and/or a microcrystalline silicon layer; the first transistor element and the second transistor element constitute a light sensor circuit; the first transistor element serves as a sensor output of the light sensor circuit; and the second transistor element serves as a light sensor element of the light sensor circuit.

According to the above configuration, it is possible to provide a circuit board that employs, as a light sensor element of the light sensor circuit, the second transistor element that has a relatively high sensitivity to light.

In the circuit board of the present invention, preferably, the first semiconductor layer is an oxide semiconductor layer.

The above configuration employs, as a light sensor element of the light sensor circuit, the second transistor element that has a relatively high sensitivity to light is employed. Further, the first transistor element is used as an output amplifier (sensor output element) of the light sensor element. This first transistor element makes it possible to provide a high output voltage without increasing a size of a channel layer of the first transistor element. This makes it possible to provide a circuit board which includes a high-performance small-size light sensor circuit that has a high SN ratio.

The circuit board of the present invention further preferably includes a capacitor element including: (a) a capacitor electrode formed by the second conductive layer; and (b) a capacitor counter electrode formed by either the first conductive layer or the third conductive layer, the capacitor counter electrode being formed so that at least a part of the capacitor counter electrode overlaps with the capacitor electrode when viewed from above.

With the above configuration, a single insulating substrate is further provided with a capacitor element that can be formed in the same production process as a production process of the first transistor element and the second transistor element.

Therefore, it becomes possible to produce the circuit board that is provided with the first transistor element, the second transistor element and the capacitor element, without any additional production process for incorporating the capacitor element into the circuit board.

In the circuit board of the present invention, preferably, the insulating substrate is provided with a display region; the display region is provided with a plurality of pixels arranged in a matrix manner; one of the first transistor element and the second transistor element is provided as a switching element for controlling each of the plurality of pixels to be turned on/off; the other one of the first transistor element and the second transistor element is provided in at least a part of the plurality of pixels; and the first transistor element and the second transistor element are formed so as to at least partially overlap each other when viewed from above.

With the above configuration, it is possible to overlap (a) one of the first transistor element and the second transistor element that is provided as a switching element for controlling each of the plurality of elements to be turned on/off, with (b) the other one of the first transistor element and the second transistor element that is provided in at least some of the plurality of pixels, when the first transistor element and the second transistor element are viewed from above.

This makes it possible to reduce a formation area where the first transistor element and the second transistor element are formed. This makes it possible to provide a circuit board that has a high aperture ratio in each of the plurality of pixels.

In the circuit board of the present invention, preferably, in each of the plurality of pixels, the first transistor element is formed as the switching element for controlling each of the plurality of pixels to be turned on/off, the first transistor element including the first semiconductor layer made of an oxide semiconductor layer; and in at least a part of the plurality of pixels, the second transistor element is formed, the second transistor element including the second semiconductor layer made of a semiconductor layer containing an amorphous silicon layer and/or a microcrystalline silicon layer, the second transistor element constituting a light sensor circuit.

According to the above configuration, in the circuit board that includes a light sensor circuit, the first transistor element and the second transistor element can be overlapped with each other when viewed from above. This makes it possible to reduce an area that is occupied by a formation area of the first transistor element and the second transistor element. Here, the first transistor element and the second transistor element are formed in each of the plurality of pixels that are provided with the light sensor circuit. As a result, it becomes possible to provide a circuit board that has a high aperture ratio.

In a case where the circuit board that has a high aperture ratio is used for production of, for example, a liquid crystal display device, a light amount of a backlight can be reduced in the liquid crystal display device that includes the backlight. This consequently makes it possible to achieve a lower power consumption.

Further, by using such a circuit board, it becomes possible to provide a display device that has a light sensor function, for example, a touch-panel-integrated display device that has a touch panel (area sensor) function.

Note that the light sensor circuit can be provided in each of all the plurality of pixels or in every pixel that displays a specific color. Alternatively, the light sensor circuit can be provided over a plurality of pixels.

Further, according to the above configuration, the first transistor element is formed in each of the plurality of pixels. The first transistor element includes, as a channel layer, the oxide semiconductor layer that has a relatively high mobility without increasing a size of the channel layer.

According to the above configuration, it is possible to form the first transistor element in each of the plurality of pixels while reducing a size of the first transistor element. This makes it possible to provide a circuit board that has a high aperture ratio indicative of a ratio of an area where light can transmit in each of the plurality of pixels.

In a case where a display device is produced by using an active matrix substrate that has a high aperture ratio, a light amount of a backlight can be reduced in a liquid crystal display device that includes the backlight. This consequently makes it possible to achieve a lower power consumption Preferably, the circuit board of the present invention further includes a drive circuit for driving each of the first transistor element and the second transistor element formed in the display region, the drive circuit being provided in a peripheral region of the display region, the drive circuit including the first transistor element including the first semiconductor layer made of an oxide semiconductor layer.

According to the above configuration, the first transistor element is provided in the drive circuit that is formed in a peripheral region of the display region.

Because the first transistor element includes, as a channel layer, the oxide semiconductor layer, the first transistor element can have a relatively high mobility without increasing a size of the first transistor element. Therefore, it becomes possible to reduce a formation area where the drive circuit is formed, in the peripheral region of the display region. This consequently makes it possible to provide a circuit board whose frame region is reduced.

Preferably, the circuit board further includes: a protective circuit protecting the transistor element provided as the switching element for controlling an/off action of each of the plurality of pixels, the protective circuit including the second transistor element formed by using a semiconductor layer containing an amorphous silicon layer and/or a microcrystalline silicon layer.

According to the above configuration, the protective circuit includes the second transistor element that includes, as a channel layer, the semiconductor layer containing an amorphous silicon layer and/or a microcrystalline silicon layer and that has a relatively low mobility.

In a configuration where the second transistor element is provided in the protective circuit, an area occupied by the protective circuit can be reduced, as compared to a case where the protective circuit is provided with the first transistor element that includes the oxide semiconductor layer serving as a channel layer.

According to the above configuration, it is possible to protect the transistor element that is formed in the display region in the circuit board, from noise or the like such as external static electricity. At the same time, it becomes possible to reduce a formation area where the protective circuit is formed in the peripheral region of the display region. This makes it possible to provide a circuit board whose frame region is reduced.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is applicable to a circuit board in which a transistor element (thin film transistor) is formed and a display device including the circuit board.

REFERENCE SIGNS LIST 1 circuit board
2 insulating substrate 3 oxide TFT element (first transistor element)
3s/3d source and drain electrode layer of oxide TFT element
3h oxide semiconductor layer (first semiconductor layer)
4 first gate insulating layer (first insulating layer)
5, 5a a-Si TFT element (second transistor element)
5s/5d source and drain electrode layer of a-Si TFT element
5h hydrogenated amorphous silicon layer (second semiconductor layer)
6 second gate insulating layer (second insulating layer)
7 capacitor element
8, 8a oxide pixel TFT element (second transistor element)
11, 11a, 11b TFT substrate (circuit board)
12, 23 display scan signal line drive circuit (drive circuit)
13, 24 display video signal line drive circuit (drive circuit)
14 sensor scan signal line drive circuit (drive circuit)
15 sensor reading circuit (drive circuit)
18 auxiliary capacitor (auxiliary capacitor element)
20 passivation film
21 pixel electrode
26 protective circuit
R1 display region
CH1, CH2, CH3 contact holes

The invention claimed is:

1. A circuit board of a display device comprising:
a plurality of transistor elements on an insulating substrate, the plurality of transistor elements including:
a first type of the plurality of transistor elements including an oxide semiconductor material; and
a second type of the plurality of transistor elements including a semiconductor material which is different from the oxide semiconductor material; wherein
each of the first type of the plurality of transistor elements and the second type of the plurality of transistor elements includes a gate portion, a drain portion and a source portion;
the gate portions of the first and second types of the plurality of transistor elements are defined by a same layer;
at least one portion of the drain portion of the first type of the plurality of transistor elements is defined by a same layer that defines at least one portion of the drain portion and the source portion of the second type of the plurality of transistor elements;
the at least one portion of the drain portion of the first type of the plurality of transistor elements is connected to a pixel electrode; and
a first distance between an upper surface of the source portion and the drain portion of the second type of the plurality of transistor elements and an upper surface of the insulating substrate is longer than a second distance between an upper surface of the at least one portion of the drain portion of the first type of the plurality of transistor elements and the upper surface of the insulating substrate.

2. The circuit board according to claim 1, wherein the at least one portion of the drain portion of the first type of the plurality of transistor elements includes an uppermost conductive layer and a lowermost conductive layer of the plurality of transistor elements.

3. The circuit board according to claim 1, wherein the oxide semiconductor material of the first type of the plurality of transistor elements includes In, Ga, and Zn.

4. The circuit board according to claim 1, wherein the semiconductor material of the second type of the plurality of transistor elements is amorphous silicon or microcrystalline silicon.

5. The circuit board according to claim 1, wherein the first type of the plurality of transistor elements defines a first circuit.

6. The circuit board according to claim 5, wherein the first circuit is a pixel circuit.

7. The circuit board according to claim 1, wherein the first type of the plurality of transistor elements defines a pixel driving transistor element.

8. The circuit board according to claim 1, wherein the second type of the plurality of transistor elements defines a second circuit.

9. The circuit board according to claim 8, wherein the second circuit is a light sensor circuit.

10. The circuit board according to claim 8, wherein the third type of the plurality of transistor elements in combination with the second type of the plurality of transistor elements define the second circuit.

11. The circuit board according to claim 1, wherein the second type of the plurality of transistor elements defines a light sensor element.

12. The circuit board according to claim 1, further comprising a third type of the plurality of transistor elements that includes an oxide semiconductor material and is connected to the second type of the plurality of transistor elements.

13. The circuit board according to claim 12, wherein the oxide semiconductor material of the third type of the plurality of transistor elements includes In, Ga, and Zn.

14. The circuit board according to claim 12, wherein the third type of the plurality of transistor elements is a top gate transistor element.

15. The circuit board according to claim 1, wherein the first and second types of the plurality of transistor elements at least partially overlap each other in a plan view of the circuit board.

16. The circuit board according to claim 1, wherein the first type of the plurality of transistor elements is a top gate transistor element.

17. The circuit board according to claim 1, wherein the second type of the plurality of transistor elements is a bottom gate transistor element.

18. A display device comprising the circuit board according to claim 1.

19. A liquid crystal display comprising the circuit board according to claim 1.

* * * * *